(12) United States Patent
Isobe

(10) Patent No.: US 9,029,863 B2
(45) Date of Patent: May 12, 2015

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventor: Atsuo Isobe, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/860,894

(22) Filed: Apr. 11, 2013

(65) Prior Publication Data

US 2013/0277670 A1  Oct. 24, 2013

(30) Foreign Application Priority Data

Apr. 20, 2012  (JP) .................................. 2012-096443

(51) Int. Cl.
  *H01L 29/12* (2006.01)
  *H01L 29/786* (2006.01)
  *H01L 29/66* (2006.01)

(52) U.S. Cl.
  CPC ...... *H01L 29/7869* (2013.01); *H01L 29/66969* (2013.01); *H01L 29/78648* (2013.01); *H01L 29/78696* (2013.01)

(58) Field of Classification Search
  CPC ............... H01L 29/7869; H01L 29/66969; H01L 29/78648; H01L 29/78696; H01L 27/088; H01L 27/10879; H01L 27/11807; H01L 29/0653; H01L 21/82; H01L 2924/2426
  USPC ............ 257/57, 59, 72, 66, 68, 71, 296, 202, 257/213, 250, 368, 499, E27.001, E27.029, 257/E27.034, E27.06, E27.084, E29.169, 257/E29.264, E28.319
  See application file for complete search history.

(56) References Cited

U.S. PATENT DOCUMENTS 5,528,032 A  6/1996  Uchiyama
5,731,856 A  3/1998  Kim et al.
(Continued)

FOREIGN PATENT DOCUMENTS

CN  101794791  8/2010
CN  102315278  1/2012
(Continued)

OTHER PUBLICATIONS

International Search Report (Application No. PCT/JP2013/061560) Dated Jul. 2, 2013.

(Continued)

*Primary Examiner* — Galina Yushina
(74) *Attorney, Agent, or Firm* — Eric J. Robinson; Robinson Intellectual Property Law Office, P.C.

(57) ABSTRACT

A variation in electrical characteristics, such as a negative shift of the threshold voltage or an increase in S value, of a fin-type transistor including an oxide semiconductor material is prevented. An oxide semiconductor film is sandwiched between a plurality of gate electrodes with an insulating film provided between the oxide semiconductor film and each of the gate electrodes. Specifically, a first gate insulating film is provided to cover a first gate electrode, an oxide semiconductor film is provided to be in contact with the first gate insulating film and extend beyond the first gate electrode, a second gate insulating film is provided to cover at least the oxide semiconductor film, and a second gate electrode is provided to be in contact with part of the second gate insulating film and extend beyond the first gate electrode.

17 Claims, 15 Drawing Sheets

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 7,892,898 | B2 | 2/2011 | Oba |
| 8,278,162 | B2 | 10/2012 | Akimoto et al. |
| 8,395,157 | B2 | 3/2013 | Park et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0075122 | A1* | 4/2004 | Lin et al. ................. 257/288 |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0066015 | A1* | 3/2007 | Park et al. ................. 438/257 |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280065 | A1 | 11/2009 | Hosono et al. |
| 2010/0065844 | A1 | 3/2010 | Tokunaga |
| 2010/0066653 | A1* | 3/2010 | Yamazaki et al. ............ 345/76 |
| 2010/0092800 | A1 | 4/2010 | Itagaki et al. |
| 2010/0109002 | A1 | 5/2010 | Itagaki et al. |
| 2010/0140608 | A1 | 6/2010 | Park et al. |
| 2010/0140710 | A1* | 6/2010 | Kuroda ................. 257/350 |
| 2010/0163874 | A1 | 7/2010 | Koyama et al. |
| 2011/0079784 | A1 | 4/2011 | Im |
| 2011/0193077 | A1* | 8/2011 | Yamazaki ................. 257/43 |
| 2011/0309456 | A1 | 12/2011 | Yamazaki |
| 2012/0007084 | A1 | 1/2012 | Park et al. |
| 2013/0157399 | A1 | 6/2013 | Park et al. |
| 2013/0161606 | A1 | 6/2013 | Isobe et al. |
| 2013/0175530 | A1 | 7/2013 | Noda et al. |
| 2013/0181214 | A1 | 7/2013 | Yamazaki et al. |
| 2013/0187150 | A1 | 7/2013 | Yamazaki et al. |

FOREIGN PATENT DOCUMENTS

| | | |
|---|---|---|
| EP | 1737044 A | 12/2006 |
| EP | 2202802 A | 6/2010 |
| EP | 2226847 A | 9/2010 |
| EP | 2515337 A | 10/2012 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2010-171394 A | 8/2010 |
| JP | 2011-082487 A | 4/2011 |
| JP | 2012-019206 A | 1/2012 |
| KR | 2010-0075407 A | 7/2010 |
| KR | 2011-0037220 A | 4/2011 |
| KR | 2012-0004786 A | 1/2012 |
| WO | WO-2004/114391 | 12/2004 |

OTHER PUBLICATIONS

Written Opinion (Application No. PCT/JP2013/061560) Dated Jul. 2, 2013.

Fortunato.E et al., "Wide-Bandgap High-Mobility ZnO Thin-Film Transistors Produced At Room Temperature,", Appl. Phys. Lett. (Applied Physics Letters), Sep. 27, 2004, vol. 85, No. 13, pp. 2541-2543.

(56) References Cited

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the $In_2O_3$-$Ga_2ZnO_4$-$ZnO$ system at 1350° C,", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) $In_2O_3$-$ZnGa_2O_4$-$ZnO$ System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters) , Sep. 13, 2004, vol. 65, No. 11, pp. 1993-1995.

Li.C et al., "Modulated Structures of Homologous Compounds $InMO_3(ZnO)_m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$-$In_2O_3$-ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MOO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2006, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

(56) References Cited

OTHER PUBLICATIONS

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu, or Zn] At Temperatures Over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-Induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

SEMICONDUCTOR DEVICE AND METHOD FOR MANUFACTURING THE SAME

TECHNICAL FIELD

The present invention relates to a semiconductor device and a method for manufacturing the semiconductor device. In this specification, a semiconductor device refers to a semiconductor element itself or a device including a semiconductor element. As an example of such a semiconductor element, for example, a thin film transistor can be given. Therefore, semiconductor devices include liquid crystal display devices and memory devices.

BACKGROUND ART

Transistors in which an active layer is formed using a semiconductor thin film which is formed over a substrate having an insulating surface are widely used in electronic devices such as integrated circuits (ICs) and image display devices (display devices).

Conventional thin film transistors mostly have what is called a planar structure, in which a semiconductor film, an insulating film, an electrode, and the like are stacked over a plane. Owing to advances in manufacturing processes which enable miniaturization of such transistors, channel width is reduced, which causes a reduction in on-state current. Therefore, in recent years, a transistor having a novel structure which is an alternative to the conventional planar structure has been developed. For example, Patent Document 1 discloses a fin-type transistor in which a polycrystalline silicon film is used as an active layer (referred to as a semiconductor thin film in Patent Document 1).

REFERENCE

Patent Document

[Patent Document 1] Japanese Published Patent Application No. 2009-206306

DISCLOSURE OF INVENTION

A transistor in which an active layer has a fin-type structure as disclosed in Patent Document 1 can have small off-state current (current flowing between a source and a drain at the time when the transistor is in an off state) as compared with a planar transistor; therefore, such a transistor is effective in reduction of power consumption. However, it is obvious that requirement for semiconductor devices with low power consumption will further increase in the future. Therefore, measures for a further reduction in off-state current of transistors are needed.

As one way to reduce an off-state current of a transistor, the use of an oxide semiconductor material for an active layer in the transistor is proposed. It is reported that a transistor in which an oxide semiconductor material is used for an active layer has extremely small off-state current as compared with a transistor including a silicon-based semiconductor material and can be reduced in its off-state current to a level which cannot be measured by an ordinary method.

In order to achieve high-speed operation, low power consumption, high integration, cost reduction, or the like of a transistor, it is necessary to miniaturize a transistor. However, there is a concern that miniaturization of a transistor might cause a variation in its electrical characteristics, such as a negative shift of the threshold voltage or an increase in sub-threshold value (S value).

In view of the above problems, an object of one embodiment of the present invention is to provide a transistor (semiconductor device) which is a fin-type transistor including an oxide semiconductor material and has a structure which can prevent a variation in electrical characteristics, which becomes more significant as the transistor is miniaturized. Another object is to provide a method for manufacturing the transistor (semiconductor device).

One embodiment of the present invention is a fin-type transistor in which an oxide semiconductor film is sandwiched between a plurality of gate electrodes with an insulating film provided between the oxide semiconductor film and each of the gate electrodes. Specifically, a first gate insulating film is provided to cover a first gate electrode, an oxide semiconductor film is provided to be in contact with the first gate insulating film and extend beyond the first gate electrode, a second gate insulating film is provided to cover at least the oxide semiconductor film, and a second gate electrode is provided to be in contact with part of the second gate insulating film and extend beyond the first gate electrode.

One embodiment of the present invention is a semiconductor device including a first gate electrode, a first gate insulating film covering the first gate electrode, an oxide semiconductor film which is in contact with the first gate insulating film and extends beyond the first gate electrode, a second gate insulating film covering at least the oxide semiconductor film, a second gate electrode which is in contact with part of the second gate insulating film and extends beyond the first gate electrode, and a source electrode and a drain electrode which are electrically connected to the oxide semiconductor film and between which the second gate electrode is located.

Another embodiment of the present invention is a semiconductor device including a first gate electrode, a first gate insulating film covering the first gate electrode, an oxide semiconductor film which is in contact with the first gate insulating film and extends beyond the first gate electrode, a second gate insulating film covering at least the oxide semiconductor film, a second gate electrode which is in contact with part of the second gate insulating film and extends beyond the first gate electrode, an interlayer film over the second gate insulating film and the second gate electrode, and a source electrode and a drain electrode over the interlayer film. The source electrode and the drain electrode are electrically connected to the oxide semiconductor film through openings in the second gate insulating film and the interlayer film. The second gate electrode is located between the source electrode and the drain electrode.

In the above structure, it is preferable that the oxide semiconductor film include a channel formation region and a pair of low-resistance regions with the channel formation region therebetween, the channel formation region overlap with the second gate electrode, and the source electrode and the drain electrode be electrically connected to the pair of low-resistance regions.

Another embodiment of the present invention is a semiconductor device including a first gate electrode, a first gate insulating film covering the first gate electrode, an oxide semiconductor film which is in contact with the first gate insulating film and extends beyond the first gate electrode, a source electrode and a drain electrode which are in contact with part of the oxide semiconductor film and extend beyond the first gate electrode, a second gate insulating film covering at least the oxide semiconductor film, the source electrode, and the drain electrode, and a second gate electrode which is in contact with part of the second gate insulating film and extends beyond the first gate electrode.

In the above structure, the second gate electrode may overlap with part of the source electrode and part of the drain electrode with the second gate insulating film provided therebetween.

The above structure includes a capacitor. The capacitor includes a lower electrode film, an inter-electrode insulating film covering the lower electrode film, and an upper electrode film which is in contact with part of the inter-electrode insulating film and extends beyond the lower electrode film. It is preferable that the first gate electrode and the lower electrode film have the same composition, the first gate insulating film and the inter-electrode insulating film have the same composition, and the second gate electrode and the upper electrode film have the same composition.

Another embodiment of the present invention is a method for manufacturing a semiconductor device, including the steps of forming a first gate electrode, forming a first gate insulating film covering the first gate electrode, forming an oxide semiconductor film which is in contact with the first gate insulating film and extends beyond the first gate electrode, forming a second gate insulating film covering at least the oxide semiconductor film, forming a second gate electrode which is in contact with part of the second gate insulating film and extends beyond the first gate electrode, forming an interlayer film over the second gate insulating film and the second gate electrode, providing openings in the second gate insulating film and the interlayer film, and forming, over the interlayer film, a source electrode and a drain electrode electrically connected to the oxide semiconductor film. The second gate electrode is located between the source electrode and the drain electrode.

In the above manufacturing method, after the second gate electrode is formed, an impurity is preferably added to the oxide semiconductor film so that the second gate electrode is formed to overlap with a channel formation region in a self-aligned manner and a pair of low-resistance regions is formed with the channel formation region therebetween in a self-aligned manner in the oxide semiconductor film.

Another embodiment of the present invention is a method for manufacturing a semiconductor device, including the steps of forming a first gate electrode, forming a first gate insulating film covering the first gate electrode, forming an oxide semiconductor film which is in contact with the first gate insulating film and extends beyond the first gate electrode, forming a source electrode and a drain electrode which are in contact with part of the oxide semiconductor film and extend beyond the first gate electrode, forming a second gate insulating film covering at least the oxide semiconductor film, the source electrode, and the drain electrode, and forming a second gate electrode which is in contact with part of the second gate insulating film and extends beyond the first gate electrode.

In the above manufacturing method, the second gate electrode may overlap with part of the source electrode and part of the drain electrode with the second gate insulating film provided therebetween.

In the above manufacturing method, the case where the semiconductor device includes a capacitor is described. Specifically, a lower electrode film is formed in the same layer as the first gate electrode, an inter-electrode insulating film covering the lower electrode film is formed, and an upper electrode film which is in contact with part of the inter-electrode insulating film and extends beyond the lower electrode film is formed. The first gate electrode and the lower electrode film are formed in the same step, the first gate insulating film and the inter-electrode insulating film are formed in the same step, and the second gate electrode and the upper electrode film are formed in the same step.

With the above structure, a region which is less likely to be acted upon by an electric field of the second gate electrode, which functions as a front gate electrode, can be controlled by an electric field of the first gate electrode, which functions as a back gate electrode; thus, a variation in electrical characteristics, such as a negative shift of the threshold voltage or an increase in S value, can be prevented. Further, the on-state current of the transistor can be increased owing to the electric field of the back gate electrode.

In addition, the capacitor can be formed through the same process as the transistor with use of the gate electrodes and the gate insulating film of the transistor. Since the transistor and the capacitor can be formed through the same process, the capacitor can be efficiently formed. Moreover, the lower electrode film has a fin-type structure; thus, the capacitor can have a large capacitance as compared with the case of a capacitor with a planar lower electrode film.

BEST MODE FOR CARRYING OUT THE INVENTION

Figure 1A:
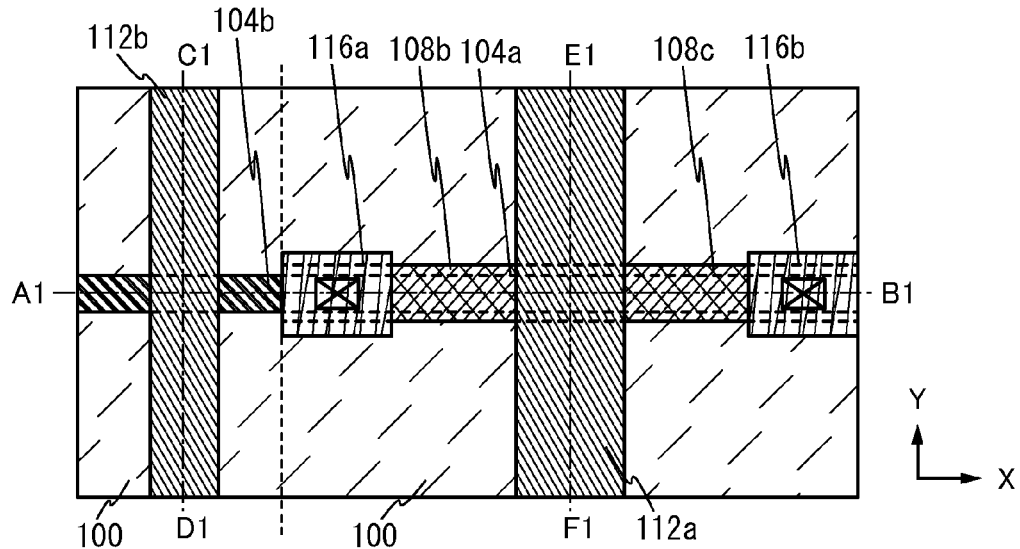
FIGS. 1A to 1C are a top view and cross-sectional views which illustrate one embodiment of a semiconductor device.

Hereinafter, embodiments of the present invention will be described in detail with reference to the accompanying drawings. Note that the present invention is not limited to the description below, and it is easily understood by those skilled in the art that a variety of changes and modifications can be made without departing from the spirit and scope of the present invention. Therefore, the present invention should not be construed as being limited to the descriptions of the embodiments below. In describing structures of the present invention with reference to the drawings, the same reference numerals are used in common for the same portions in different drawings. The same hatching pattern is applied to similar parts, and the similar parts are not especially denoted by reference numerals in some cases. In addition, for convenience, an insulating film such as a gate insulating film is not illustrated in a top view in some cases.

Note that in this specification and the like, the term such as "over" does not necessarily mean that a component is placed "directly on" another component. For example, the expression "a gate electrode over a gate insulating film" can mean the case where there is an additional component between the gate insulating film and the gate electrode. The same applies to the term "below".

In addition, in this specification and the like, the term such as "electrode" or "wiring" does not limit a function of a component. For example, an "electrode" is sometimes used as part of a "wiring", and vice versa. In addition, the term "electrode" or "wiring" can also mean a combination of a plurality of "electrodes" and "wirings", for example.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification.

Note that in this specification and the like, the term "electrically connected" includes the case where components are connected through an object having any electric function. There is no particular limitation on an object having any electric function as long as electric signals can be transmitted and received between components that are connected through the object.

Examples of an "object having any electric function" are an electrode and a wiring.

Furthermore, in this specification, ordinal numbers, such as "first" and "second," are used merely for convenience, and the present invention is not limited to the numbers.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

Embodiment 1

In this embodiment, an example of a structure of a semiconductor device and a method for manufacturing the semiconductor device will be described with reference to FIGS. 1A to 1C, FIGS. 2A to 2D, and FIGS. 3A to 3D.

<Example of Structure of Semiconductor Device>

Figure 1B:
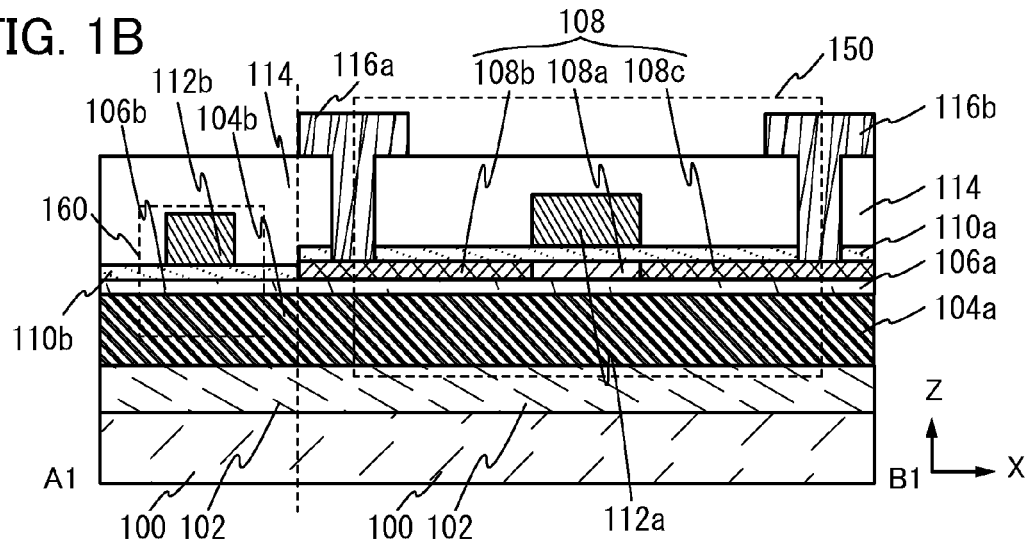
Figure 1C:
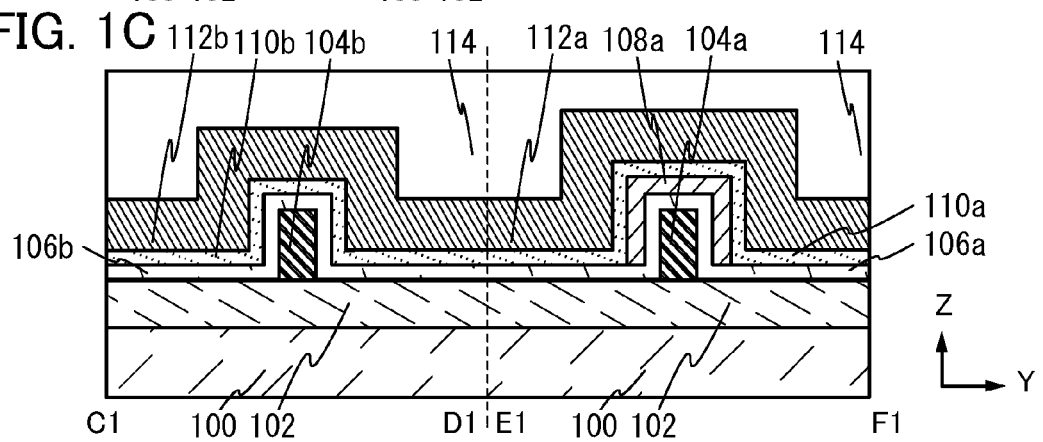

FIGS. 1A to 1C show an example of a top view and cross-sectional views of a semiconductor device including a dual-gate transistor 150 and a capacitor 160. FIG. 1A is a top view, FIG. 1B is a cross-sectional view taken along a dashed-dotted line A1-B1 in FIG. 1A, and FIG. 1C is a cross-sectional view taken along a dashed-dotted line C1-D1 and a dashed-dotted line E1-F1 in FIG. 1A.

The transistor 150 illustrated in FIGS. 1A to 1C includes a base insulating film 102 over a substrate 100 having an insulating surface, a gate electrode 104a over the base insulating film 102, a gate insulating film 106a covering the gate electrode 104a, an oxide semiconductor film 108 provided to be in contact with the gate insulating film 106a and extend beyond the gate electrode 104a, a gate insulating film 110a covering at least the oxide semiconductor film 108, a gate electrode 112a provided to be in contact with part of the gate insulating film 110a and extend beyond the gate electrode 104a, an interlayer film 114 over the gate insulating film 110a and the gate electrode 112a, and a source electrode 116a and a drain electrode 116b, between which the gate electrode 112a is located, provided over the interlayer film 114 to be electrically connected to the oxide semiconductor film 108 through openings provided in the gate insulating film 110a and the interlayer film 114. The oxide semiconductor film 108 includes a channel formation region 108a and low-resistance regions 108b and 108c with the channel formation region 108a sandwiched therebetween. The channel formation region 108a overlaps with the gate electrode 112a. The source electrode 116a and the drain electrode 116b are electrically connected to the low-resistance region 108b and the low-resistance region 108c, respectively.

When the oxide semiconductor film 108 is seen from a direction perpendicular to a surface of the base insulating film 102 or a surface where the base insulating film 102 is formed as illustrated in FIG. 1A, the channel length direction of the oxide semiconductor film 108 and the channel width direction thereof may be referred to as an X-axis direction (or A1-B1 direction) and a Y-axis direction (or E1-F1 direction), respectively. In addition, a direction perpendicular to an X-Y plane may be referred to as a Z-axis direction.

In this embodiment, the gate electrode 104a extends in the X-axis direction and the gate electrode 112a extends in the Y-axis direction.

In the transistor 150 of one embodiment of the present invention, a region which is less likely to be acted upon by an electric field of the gate electrode 112a, which functions as a front gate electrode, can be controlled by an electric field of the gate electrode 104a, which functions as a back gate electrode; thus, a variation in electrical characteristics, such as a negative shift of the threshold voltage or an increase in S value, can be prevented. Further, the on-state current of the transistor can be increased owing to the electric field of the back gate electrode.

Further, the capacitor 160 illustrated in FIGS. 1A to 1C includes a lower electrode film 104b, an upper electrode film 112b, and an inter-electrode insulating film 106b and an inter-electrode insulating film 110b which are sandwiched between the lower electrode film 104b and the upper electrode film 112b.

<Method for Manufacturing Semiconductor Device>

An example of a manufacturing process of the semiconductor device illustrated in FIGS. 1A to 1C is described with reference to FIGS. 2A to 2D and FIGS. 3A to 3D.

Figure 2A:
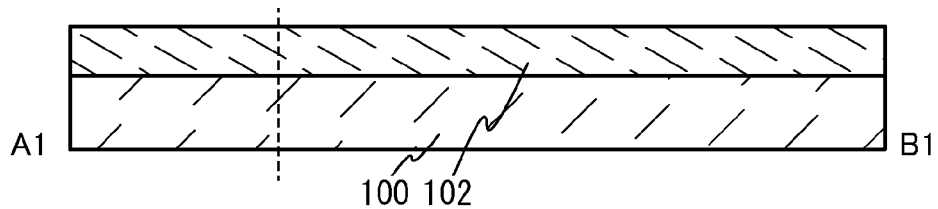
FIGS. 2A to 2D illustrate one embodiment of a method for manufacturing a semiconductor device.

First, the substrate 100 having an insulating surface is prepared, and the base insulating film 102 is formed over the substrate 100 (see FIG. 2A).

There is no particular limitation on a substrate that can be used as the substrate 100 having an insulating surface as long as it has heat resistance enough to withstand heat treatment performed later. For example, a glass substrate of barium borosilicate glass, aluminoborosilicate glass, or the like, a ceramic substrate, a quartz substrate, a sapphire substrate, or the like can be used. As long as the substrate 100 has an insulating surface, a single crystal semiconductor substrate or a polycrystalline semiconductor substrate of silicon, silicon carbide, or the like; a compound semiconductor substrate of silicon germanium or the like; an SOI substrate; or the like can be used. Alternatively, an insulating surface may be provided by forming an insulating film or the like over a transistor including a material such as silicon as a semiconductor material, and the insulating film may be used as a substrate.

Further alternatively, a flexible substrate may be used as the substrate 100. In the case where a flexible substrate is used, the transistor 150 including the oxide semiconductor film 108 may be directly formed over the flexible substrate, or alternatively, the transistor 150 including the oxide semiconductor film 108 may be formed over a manufacturing substrate and separated from the manufacturing substrate to be transferred to the flexible substrate. Note that in order to separate the transistor 150 from the manufacturing substrate and transfer it to the flexible substrate, a separation layer may be provided between the manufacturing substrate and the transistor 150 including the oxide semiconductor film 108.

Note that the substrate 100 is preferably made to shrink (also referred to as thermally shrink) by heat treatment performed in advance at a temperature lower than the strain point of the substrate 100, whereby shrinkage caused by heating of the substrate in the manufacturing process of the transistor 150 can be suppressed. Thus, misalignment of masks in a light exposure step or the like can be suppressed, for example. In addition, moisture and organic substances which are attached to the surface of the substrate 100 can be removed by the heat treatment.

The base insulating film 102 is formed with a thickness greater than or equal to 50 nm and less than or equal to 2 µm by a plasma CVD method or a sputtering method with the use of one of a silicon oxide film, a gallium oxide film, a zinc oxide film, an aluminum oxide film, a Ga—Zn oxide film, a silicon nitride film, a silicon oxynitride film, an aluminum oxynitride film, and a silicon nitride oxide film or a stack of any of these films. The base insulating film 102 can prevent entry of impurities from the substrate 100 side. Note that the base insulating film 102 is not necessarily provided.

The base insulating film 102 is preferably formed using an insulating film (oxygen supply film) from which oxygen is released by heat treatment.

Note that "oxygen is released by heat treatment" described above means that the amount of released oxygen which is converted into oxygen atoms is greater than or equal to $1.0 \times 10^{19}$ atoms/cm$^3$, preferably greater than or equal to $3.0 \times 10^{19}$ atoms/cm$^3$, further preferably greater than or equal to $1.0 \times 10^{20}$ atoms/cm$^3$, still further preferably greater than or equal to $3.0 \times 10^{20}$ atoms/cm$^3$ in thermal desorption spectroscopy (TDS) analysis.

Here, a method for measuring the amount of released oxygen by conversion into oxygen atoms using the TDS analysis is described below.

The amount of released gas in the TDS analysis is proportional to the integral value of a spectrum with respect to elapsed time. Therefore, the amount of released gas can be calculated from the ratio between the integral value of a measured spectrum and the reference value of a standard sample. The reference value of a standard sample refers to the ratio of the density of a predetermined atom contained in a sample to the integral value of a spectrum.

For example, the number of released oxygen molecules ($N_{O2}$) from an insulating film can be found according to Formula I with the TDS analysis results of a silicon wafer containing hydrogen at a predetermined density, which is the standard sample, and the TDS analysis results of the insulating film. Here, all spectra having a mass-to-charge ratio (M/z) of 32 which are obtained by the TDS analysis are assumed to originate from an oxygen molecule. CH$_3$OH, which is given as a gas where M/z=32, can be ignored because it is unlikely to be present. Further, an oxygen molecule including an oxygen atom where M/z=17 or 18, which is an isotope of an oxygen atom, is also not taken into consideration because the proportion of such a molecule in the natural world is minimal $$N_{O2} = \frac{N_{H2}}{S_{H2}} \times S_{O2} \times \alpha \qquad \text{[FORMULA 1]}$$

$N_{H2}$ is the value obtained by conversion of the number of hydrogen molecules desorbed from the standard sample into densities. $S_{H2}$ is the integral value of a spectrum with respect to elapsed time of the standard sample which is analyzed by TDS. Here, the reference value of the standard sample is expressed by $N_{H2}/S_{H2}$. $S_{O2}$ is the integral value of a spectrum with respect to elapsed time of the insulating film which is analyzed by TDS. A coefficient which influences the intensity of the spectrum in the TDS analysis is denoted by $\alpha$. Refer to Japanese Published Patent Application No. H06-275697 for details of Formula I. Note that the amount of released oxygen from the above insulating film is measured with a thermal desorption spectroscopy apparatus produced by ESCO Ltd., EMD-WA1000S/W using a silicon wafer containing hydrogen atoms at $1 \times 10^{16}$ atoms/cm$^2$ as the standard sample.

Further, in the TDS analysis, oxygen is partly detected as an oxygen atom. The ratio between oxygen molecules and oxygen atoms can be calculated from the ionization rate of the oxygen molecules. Note that, since the above α includes the ionization rate of the oxygen molecules, the number of the released oxygen atoms can also be estimated through the evaluation of the number of the released oxygen molecules.

Note that $N_{O2}$ is the number of the released oxygen molecules. The amount of released oxygen converted into oxygen atoms is twice the number of the released oxygen molecules.

In the case where the hydrogen concentration in the oxygen supply film is higher than or equal to $7.2 \times 10^{20}$ atoms/cm$^3$, variation in initial characteristics of transistors is increased, a channel length dependence of electrical characteristics of a transistor is increased, and a transistor significantly deteriorates in the BT stress test; therefore, the hydrogen concentration in the oxygen supply film should be lower than $7.2 \times 10^{20}$ atoms/cm$^3$. In other words, the hydrogen concentration in the oxide semiconductor film is preferably lower than or equal to $5 \times 10^{19}$ atoms/cm$^3$, and the hydrogen concentration in the oxygen supply film is preferably lower than $7.2 \times 10^{20}$ atoms/cm$^3$.

Note that in this specification, "oxynitride" such as silicon oxynitride contains more oxygen than nitrogen.

Further, in this specification, "nitride oxide" such as silicon nitride oxide contains more nitrogen than oxygen.

Figure 2B:
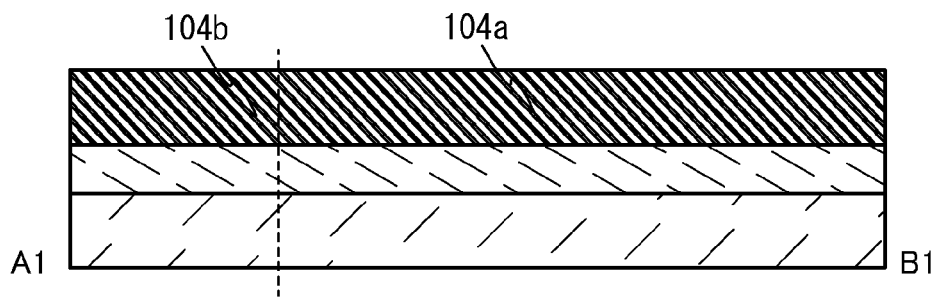

Next, a conductive film to be the gate electrode 104a and the lower electrode film 104b is formed over the base insulating film 102, a mask is formed over the conductive film by a photolithography method or the like, and part of the conductive film is regioselectively removed with the mask, so that the conductive film is patterned (see FIG. 2B).

The patterned conductive film functions as the gate electrode 104a in the transistor 150 and functions as the lower electrode film 104b in the capacitor 160. The electric field of the gate electrode 104a, which functions as a back gate electrode, can supplement the electric field applied to a region which is less likely to be acted upon by the electric field of the gate electrode 112a formed later, which functions as a front gate electrode; thus, a variation in electrical characteristics, such as a negative shift of the threshold voltage or an increase in S value, can be prevented. Further, the on-state current of the transistor 150 can be increased owing to the electric field of the gate electrode 104a. The gate electrode 104a and the lower electrode film 104b have the same composition because they are formed by patterning in the same step.

Figure 15A:
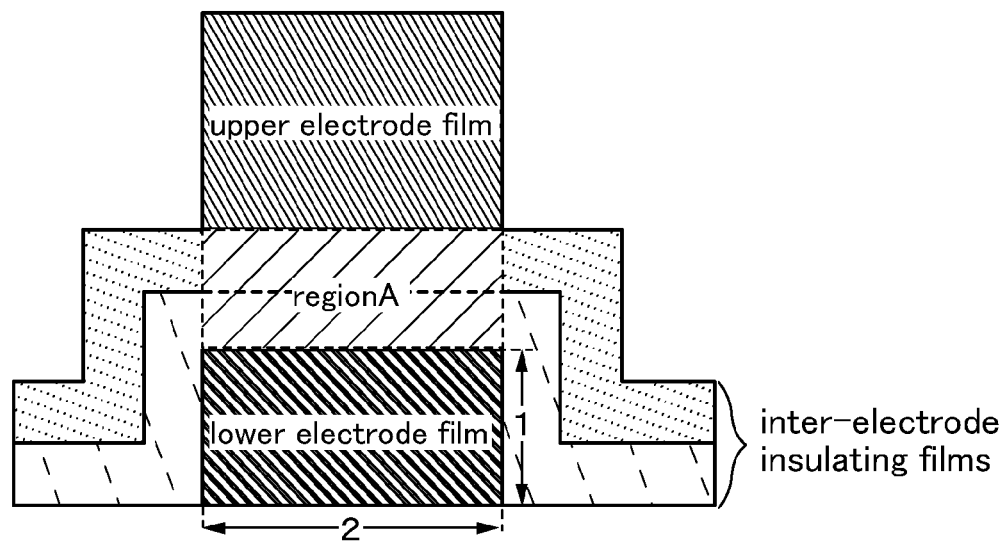
FIGS. 15A and 15B are views for describing the capacitance of a capacitor.
Figure 15B:
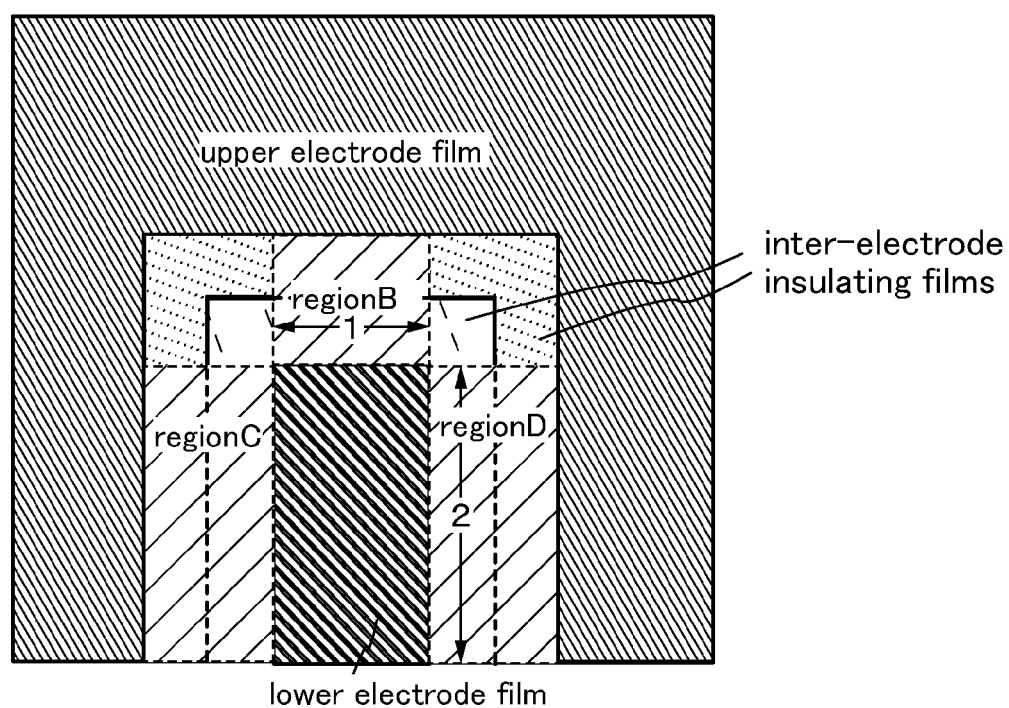

By increasing the aspect ratio (in this embodiment, the ratio of the height to the base) of the patterned conductive film, the capacitance of the capacitor 160 can be increased as compared with the case of a planar conductive film (i.e., a conductive film whose base is long). For example, when the ratio between the base and the height of a conductive film to be a lower electrode film of a capacitor is 2:1 as shown in FIGS. 15A and 15B, a portion where capacitance is formed (widely hatched regions B, C, and D in the drawing) in a capacitor shown in FIG. 15B, which has the lower electrode film having a fin-type structure, is about 2.5 times as large as a portion where capacitance is formed (a widely hatched region A in the drawing) in a capacitor shown in FIG. 15A, which has a planar lower electrode film.

The conductive film to be the gate electrode 104a and the lower electrode film 104b can be formed, for example, by using a metal material such as molybdenum, titanium, tantalum, tungsten, aluminum, copper, neodymium, or scandium; or an alloy material mainly containing any of these materials by a physical vapor deposition (PVD) method such as an evaporation method (including a vacuum evaporation method) or a sputtering method, a chemical vapor deposition (CVD) method such as a plasma CVD method, a spin coating method, or the like. Alternatively, the conductive film to be the gate electrode 104a and the lower electrode film 104b may be formed using a conductive metal oxide. As the conductive metal oxide, indium oxide ($In_2O_3$), tin oxide ($SnO_2$), zinc oxide (ZnO), indium tin oxide ($In_2O_3$—$SnO_2$, which is abbreviated to ITO in some cases), indium zinc oxide ($In_2O_3$—ZnO), or any of these metal oxide materials in which silicon or silicon oxide is contained can be used. The conductive film to be the gate electrode 104a and the lower electrode film 104b can be formed with a single-layer structure or a stacked-layer structure using any of the above materials.

As one layer of the conductive film which is to be in contact with the gate insulating film 106a formed later, a metal oxide film containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. These films are preferable because they each have a work function of 5 eV or higher, preferably 5.5 eV or higher and thus enable the threshold voltage of the transistor to take a positive value when used as the gate electrode, so that what is called a normally-off switching element can be obtained.

In the case where a copper film or an aluminum film is used for part of the gate electrode 104a and the lower electrode film 104b, a barrier film is preferably provided to prevent copper or aluminum from reaching the oxide semiconductor film 108, which is formed later. As a barrier film for blocking transfer of copper or aluminum, a tantalum nitride film, a tungsten film, a tungsten nitride film, a molybdenum film, a molybdenum nitride film, a titanium film, a titanium nitride film, a chromium film, or a chromium nitride film can be given. Any of the above films is selected as appropriate and provided to be in contact with the copper film or the aluminum film, so that copper or aluminum can be prevented from reaching the oxide semiconductor film 108.

In the case of employing a stacked-layer structure, for example, a 30-nm-thick tantalum nitride film, a 200-nm-thick copper film, and a 30-nm-thick tungsten film can be stacked to form the gate electrode 104a and the lower electrode film 104b. Further, instead of the 30-nm-thick tantalum nitride film, a tungsten film, a tungsten nitride film, a molybdenum nitride film, or a titanium nitride film may be used. Alternatively, instead of the 30-nm-thick tungsten film, a molybdenum film may be formed. The use of the copper film enables a reduction in wiring resistance. With a structure in which the tungsten film or the molybdenum film is stacked over the copper film, copper can be prevented from reaching the oxide semiconductor film 108. In addition, tungsten and molybdenum have a relatively high work function; thus, it is preferable to use the tungsten film or the molybdenum film for the gate electrode 104a because the threshold voltage of the transistor is likely to be positive (i.e., a normally-off transistor is likely to be formed). Note that when the gate insulating film 106a has a function of preventing copper from reaching the oxide semiconductor film 108, either the tungsten film or the molybdenum film is not necessarily formed.

Note that the conductive film to be the gate electrode 104a and the lower electrode film 104b may be etched using either dry etching or wet etching, or using both dry etching and wet etching.

Figure 2C:
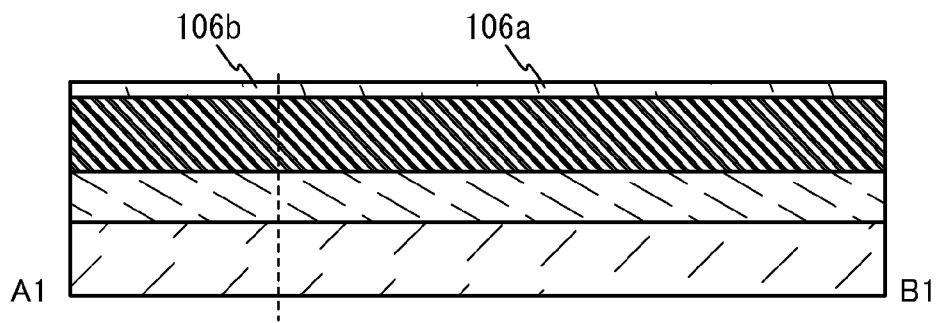

Next, an insulating film to be the gate insulating film 106a and the inter-electrode insulating film 106b is formed to cover the gate electrode 104a and the lower electrode film 104b and etching is performed, whereby the gate insulating film 106a and the inter-electrode insulating film 106b are formed (see FIG. 2C).

The insulating film to be the gate insulating film 106a and the inter-electrode insulating film 106b may be formed by depositing an insulating material (e.g., silicon nitride, silicon nitride oxide, silicon oxynitride, or silicon oxide) with use of high-density plasma, for example. Note that the insulating film to be the gate insulating film 106a and the inter-electrode insulating film 106b may be formed with a single layer or stacked layers. Here, for example, a two-layer structure in which a silicon oxynitride layer is stacked over a silicon nitride layer is employed. By using high-density plasma, plasma damage to the insulating film to be the gate insulating film 106a and the inter-electrode insulating film 106b can be reduced. Thus, dangling bonds in the insulating film to be the gate insulating film 106a and the inter-electrode insulating film 106b can be reduced and defects can be reduced, so that the interface with an oxide semiconductor formed later can be highly favorable.

The insulating film to be the gate insulating film 106a and the inter-electrode insulating film 106b preferably contains oxygen at least in a portion in contact with the oxide semiconductor film 108; specifically, at least the portion in contact with the oxide semiconductor film 108 is preferably formed using an insulating oxide from which part of oxygen is released by heating. For example, when a portion of the gate insulating film 106a which is in contact with the oxide semiconductor film 108 is formed using silicon oxide, oxygen can be diffused into the oxide semiconductor film 108, so that generation of oxygen vacancies can be prevented.

Note that the insulating film to be the gate insulating film 106a and the inter-electrode insulating film 106b may be formed using a high-k material such as hafnium silicate (Hf-$Si_xO_y$ (x>0, y>0)), hafnium silicate (Hf$Si_xO_y$ (x>0, y>0)) to which nitrogen is added, hafnium aluminate (Hf$Al_xO_y$ (x>0, y>0)) to which nitrogen is added, hafnium oxide, yttrium oxide, or lanthanum oxide, in which case gate leakage current can be reduced. Here, gate leakage current refers to leakage current which flows between a gate electrode and a source or drain electrode. Further, a layer formed using the high-k material and a layer formed using any of silicon oxide, silicon oxynitride, silicon nitride, silicon nitride oxide, zinc oxide, aluminum oxide, Ga—Zn oxide, aluminum oxynitride, and gallium oxide may be stacked. Note that even in the case where the insulating film to be the gate insulating film 106a and the inter-electrode insulating film 106b has a stacked-layer structure, the portion in contact with the oxide semiconductor film 108 is preferably formed using an insulating oxide. The gate insulating film 106a and the inter-electrode insulating film 106b have the same composition because they are formed by patterning in the same step.

The thickness of the insulating film to be the gate insulating film 106a and the inter-electrode insulating film 106b is greater than or equal to 1 nm and less than or equal to 300 nm, preferably greater than or equal to 5 nm and less than or equal to 50 nm. When the thickness of the insulating film to be the gate insulating film 106a and the inter-electrode insulating film 106b is greater than or equal to 5 nm, the gate leakage current can be particularly reduced.

Figure 2D:
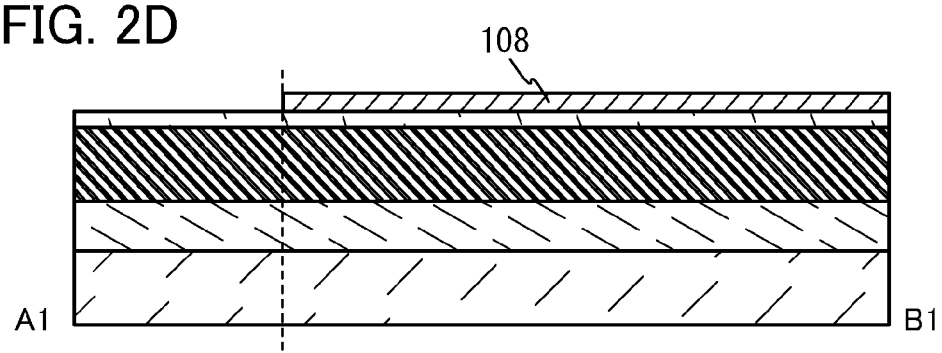

Next, the oxide semiconductor film 108 is regioselectively formed to be in contact with the gate insulating film 106a and extend beyond the gate electrode 104a (see FIG. 2D).

The oxide semiconductor film 108 may be formed by a sputtering method, a molecular beam epitaxy (MBE) method, a CVD method, a pulsed laser deposition method, an atomic layer deposition (ALD) method, or the like. The oxide semiconductor film 108 may be formed with a sputtering apparatus which performs deposition in the state where surfaces of a plurality of substrates are substantially perpendicular to a surface of a sputtering target. Note that the thickness of the oxide semiconductor film 108 is greater than 5 nm and less than or equal to 200 nm, preferably greater than or equal to 10 nm and less than or equal to 30 nm.

To reduce oxygen vacancies in the oxide semiconductor film 108 as much as possible, it is preferable that the oxide semiconductor film 108 be deposited in a deposition atmosphere in which an oxygen gas accounts for a large proportion; therefore, it is preferable to use a sputtering apparatus in which oxygen can be introduced into its deposition chamber and the gas flow rate can be adjusted. Further, 90% or more of the gas introduced into a deposition chamber of the sputtering apparatus is an oxygen gas, and in the case where another gas is used in addition to the oxygen gas, a rare gas is preferably used.

Further, when the oxide semiconductor film 108 contains a large amount of hydrogen, the hydrogen and an oxide semiconductor are bonded to each other, so that part of the hydrogen serves as a donor and causes generation of an electron which is a carrier. As a result, the threshold voltage of the transistor shifts in the negative direction. Accordingly, the hydrogen concentration in the oxide semiconductor film 108 is preferably lower than $5 \times 10^{18}$ atoms/cm$^3$, more preferably lower than or equal to $1 \times 10^{18}$ atoms/cm$^3$, still more preferably lower than or equal to $5 \times 10^{17}$ atoms/cm$^3$, further more preferably lower than or equal to $1 \times 10^{16}$ atoms/cm$^3$. Note that the above hydrogen concentration in the oxide semiconductor film is measured by secondary ion mass spectrometry (SIMS).

For the above-described reason, it is preferable that the gas used for deposition of the oxide semiconductor film 108 do not contain an impurity such as water, hydrogen, a hydroxyl group, or hydride. In other words, it is preferable to use a gas having a purity higher than or equal to 6N (99.9999%), preferably higher than or equal to 7N (99.99999%) (i.e., the impurity concentration in the gas is lower than or equal to 1 ppm, preferably lower than or equal to 0.1 ppm).

Further, in the deposition of the oxide semiconductor film 108, in order to remove moisture (including water, water vapor, hydrogen, a hydroxyl group, or hydride) in the deposition chamber, an entrapment vacuum pump such as a cryopump, an ion pump, or a titanium sublimation pump is preferably used. The evacuation unit may be a turbo molecular pump provided with a cold trap. From the deposition chamber which is evacuated with a cryopump, a hydrogen atom, a compound containing a hydrogen atom such as water ($H_2O$) (more preferably, also a compound containing a carbon atom), and the like are removed, whereby the concentration of an impurity such as hydrogen or moisture in the oxide semiconductor film 108 formed in the deposition chamber can be reduced.

Note that a target used in the sputtering apparatus preferably has a relative density greater than or equal to 90% and less than or equal to 100%, preferably greater than or equal to 95% and less than or equal to 99.9%. The use of the target with high relative density enables the formed oxide semiconductor film 108 to be a dense film.

As a material of the oxide semiconductor film 108, for example, an In-M-Zn—O-based material may be used. Here, a metal element M is an element whose bond energy with oxygen is higher than that of In and that of Zn. Alternatively, the metal element M is an element which has a function of suppressing desorption of oxygen from the In-M-Zn—O-based material. Owing to the effect of the metal element M, generation of oxygen vacancies in the oxide semiconductor film is suppressed. Therefore, change in electrical characteristics of the transistor, which is caused by oxygen vacancies, can be reduced; accordingly, a highly reliable transistor can be obtained.

Specifically, the metal element M may be Al, Sc, Ti, V, Cr, Mn, Fe, Co, Ni, Ga, Y, Zr, Nb, Mo, Sn, La, Ce, Pr, Nd, Sm, Eu, Gd, Tb, Dy, Ho, Er, Tm, Yb, Lu, Hf, Ta, or W, and is preferably Al, Ti, Ga, Y, Zr, Ce, or Hf. For the metal element M, one or more elements may be selected from the above elements. Further, Ge can be used instead of the metal element M.

Here, in the In-M-Zn—O-based material, which is an oxide semiconductor, the higher the concentration of In is, the higher the carrier mobility and the carrier density are. As a result, the oxide semiconductor has higher conductivity as the concentration of In is higher.

A structure of an oxide semiconductor film is described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around $31°$. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction perpendicular to the c-axis, a peak appears frequently when $2\theta$ is around $56°$. This peak is derived from the (110) plane of the $InGaZnO_4$ crystal. Here, analysis ($\phi$ scan) is performed under conditions where the sample is rotated around a normal vector of a sample surface as an axis ($\phi$ axis) with $2\theta$ fixed at around $56°$. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when $\phi$ scan is performed with $2\theta$ fixed at around $56°$.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of $2\theta$ may also be observed at around $36°$, in addition to the peak of $2\theta$ at around $31°$. The peak of $2\theta$ at around $36°$ indicates that a crystal having no c-axis alignment is included in part of the CAAC-OS film. It is preferable that in the CAAC-OS film, a peak of $2\theta$ appear at around $31°$ and a peak of $2\theta$ do not appear at around $36°$.

In a transistor using the CAAC-OS film, change in electric characteristics due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

The oxide semiconductor film immediately after being formed is preferably in a supersaturated state in which the proportion of oxygen is higher than that in the stoichiometric composition. For example, when the oxide semiconductor film is formed by a sputtering method, it is preferable that the film be formed in a film formation gas containing a high percentage of oxygen, and it is especially preferable that the film be formed under an oxygen atmosphere (oxygen gas: 100%). When the film is formed in a film formation gas containing a high percentage of oxygen, particularly under a 100% oxygen gas atmosphere, release of Zn from the film can be suppressed even when the film formation temperature is higher than or equal to $300°$ C., for example.

Note that the oxide semiconductor film 108 may have a structure in which a plurality of oxide semiconductor films is stacked. For example, the oxide semiconductor film 108 may be a stack of a first oxide semiconductor film and a second oxide semiconductor film that are formed using metal oxides with different compositions. For example, the first oxide semiconductor film may be formed using a three-component metal oxide, and the second oxide semiconductor film may be formed using a two-component metal oxide. Alternatively, for example, both the first oxide semiconductor film and the second oxide semiconductor film may be formed using a three-component metal oxide.

Further, it is possible that the constituent elements of the first oxide semiconductor film and the second oxide semiconductor film are the same and the compositions of the constituent elements of the first oxide semiconductor film and the second oxide semiconductor film are different. For example, the first oxide semiconductor film may have an atomic ratio of In:Ga:Zn=1:1:1, and the second oxide semiconductor film may have an atomic ratio of In:Ga:Zn=3:1:2. Alternatively, the first oxide semiconductor film may have an atomic ratio of In:Ga:Zn=1:3:2, and the second oxide semiconductor film may have an atomic ratio of In:Ga:Zn=2:1:3.

In an oxide semiconductor, the s orbital of heavy metal mainly contributes to carrier transfer, and when the In content in the oxide semiconductor is increased, overlap of the s orbitals is likely to be increased. Therefore, an oxide having a composition where In>Ga has higher mobility than an oxide having a composition where In≤Ga. Further, in Ga, the formation energy of an oxygen vacancy is larger and thus an oxygen vacancy is less likely to be generated than in In; therefore, the oxide having a composition where In≤Ga has more stable characteristics than the oxide having a composition where In>Ga.

An oxide semiconductor containing In and Ga at a proportion of In>Ga is used on the channel side, and an oxide semiconductor containing In and Ga at a proportion of In≤Ga is used on the back channel side (a side opposite to the channel), so that mobility and reliability of a transistor can be further improved.

Further, oxide semiconductors having different crystallinities may be used for the first oxide semiconductor film and the second oxide semiconductor film. That is, two of a single crystal oxide semiconductor, a polycrystalline oxide semiconductor, an amorphous oxide semiconductor, and a CAAC-OS may be combined as appropriate. When an amorphous oxide semiconductor is used for at least one of the first oxide semiconductor film and the second oxide semiconductor film, internal stress or external stress of the oxide semiconductor film 108 is relieved, variation in characteristics of a transistor is reduced, and reliability of the transistor can be further improved.

On the other hand, an amorphous oxide semiconductor is likely to absorb an impurity which serves as a donor, such as hydrogen, and an oxygen vacancy is likely to be generated; thus, an amorphous oxide semiconductor easily becomes n-type. For this reason, it is preferable to use an oxide semiconductor having crystallinity such as a CAAC-OS for the oxide semiconductor film on the channel side.

Further, the oxide semiconductor film 108 may have a stacked-layer structure of three or more layers in which an amorphous semiconductor film is interposed between a plurality of crystalline semiconductor films. Furthermore, a structure in which a crystalline semiconductor film and an amorphous semiconductor film are alternately stacked may be employed.

These two structures for making the oxide semiconductor film 108 have a stacked-layer structure of a plurality of layers can be combined as appropriate.

In the case where the oxide semiconductor film 108 has a stacked-layer structure of a plurality of layers, oxygen may be added each time the oxide semiconductor film is formed. For addition of oxygen, heat treatment in an oxygen atmosphere, an ion implantation method, an ion doping method, a plasma immersion ion implantation method, plasma treatment performed in an atmosphere containing oxygen, or the like can be employed.

Oxygen is added each time the oxide semiconductor film is formed, whereby an effect of reducing oxygen vacancies in the oxide semiconductor can be improved.

Figure 3A:
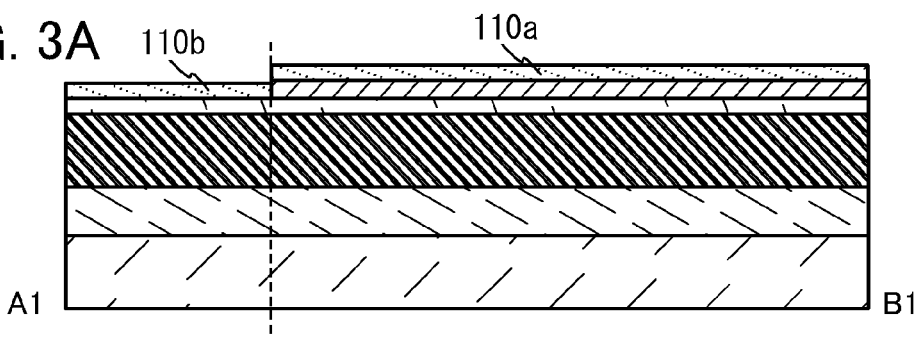
FIGS. 3A to 3D illustrate one embodiment of a method for manufacturing a semiconductor device.

Next, an insulating film to be the gate insulating film 110a and the inter-electrode insulating film 110b is formed to cover at least the oxide semiconductor film 108 and the inter-electrode insulating film 106b and etching is performed, whereby the gate insulating film 110a and the inter-electrode insulating film 110b are formed (see FIG. 3A).

The insulating film to be the gate insulating film 110a and the inter-electrode insulating film 110b can be formed using a material and a method similar to those of the aforementioned insulating film to be the gate insulating film 106a and the inter-electrode insulating film 106b. The gate insulating film 110a and the inter-electrode insulating film 110b have the same composition because they are formed by patterning in the same step.

The gate insulating film 110a and the inter-electrode insulating film 110b are preferably formed using an oxygen supply film. In addition, a blocking film (such as an $AlO_x$ film) for preventing oxygen from being released from the oxide semiconductor film is preferably provided so as to cover the oxide semiconductor film and to be positioned outside the oxygen supply film.

When the oxygen supply film or the blocking film covers the oxide semiconductor film, the oxide semiconductor film can contain oxygen in a proportion which is substantially the same as that of oxygen in the stoichiometric composition, or in a proportion higher than that of oxygen in the stoichiometric composition, i.e., the oxide semiconductor film can be supersaturated with oxygen. For example, in the case where the stoichiometric composition of the oxide semiconductor film is In:Ga:Zn:O=1:1:1:4 [atomic ratio], the ratio of oxygen atoms in the In—Ga—Zn—O film is larger than 4.

It is also possible that only one of the inter-electrode insulating film 106b and the inter-electrode insulating film 110b is formed as an inter-electrode insulating film.

Figure 3B:
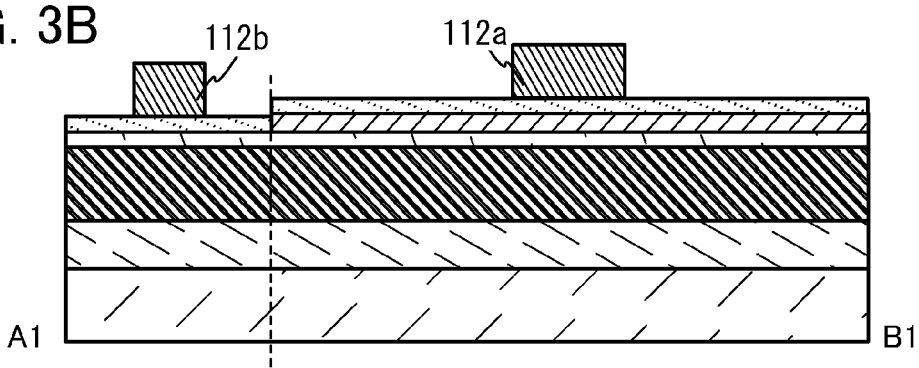

Next, a conductive film to be the gate electrode 112a and the upper electrode film 112b is formed, a mask is formed over the conductive film by a photolithography method or the like, and part of the conductive film is regioselectively removed with the mask, so that the conductive film is patterned so as to extend beyond the gate electrode 104a and the lower electrode film 104b (see FIG. 3B).

The patterned conductive film functions as the gate electrode 112a in the transistor 150 and functions as the upper electrode film 112b in the capacitor 160. The gate electrode 112a and the upper electrode film 112b have the same composition because they are formed by patterning in the same step.

The conductive film to be the gate electrode 112a and the upper electrode film 112b can be formed using a material and a method similar to those of the aforementioned conductive film to be the gate electrode 104a and the lower electrode film 104b.

The oxide semiconductor film 108 is sandwiched between the gate electrode 104a and the gate electrode 112a with the gate insulating film 106a provided between the oxide semiconductor film 108 and the gate electrode 104a and the gate insulating film 110a provided between the oxide semiconductor film 108 and the gate electrode 112a. With this structure, application of a gate field to the oxide semiconductor film 108 can be controlled in plural directions. This makes it possible to control the on/off of, for example, even a transistor which includes an oxide semiconductor film with a high carrier concentration of $1 \times 10^{17}/cm^3$ or more and whose on/off thus has not been able to be controlled.

Figure 3C:
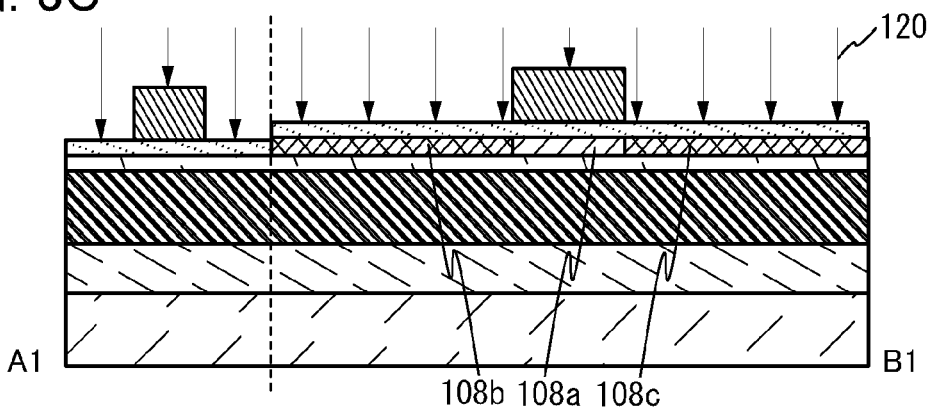

Next, an impurity 120 may be added to the oxide semiconductor film 108 so that the channel formation region 108a and the low-resistance regions 108b and 108c are formed in a self-aligned manner (see FIG. 3C).

At this time, the gate electrode 112a functions as a mask, so that the impurity 120 is not added to a region of the oxide semiconductor film 108 which overlaps with the gate electrode 112a; thus, the channel formation region 108a is formed in a self-aligned manner.

Note that in the oxide semiconductor film 108, the crystal structure is disordered in a region where the impurity 120 is added, so that the region is likely to be in an amorphous state. Therefore, in the case where a film having crystallinity such as a CAAC-OS film is used as the oxide semiconductor film 108 and the impurity 120 is added to the film, the channel formation region 108a keeps the state of the oxide semiconductor film having crystallinity, because impurities are not added thereto, and each of the low-resistance regions 108b and 108c, which do not overlap with the gate electrode 112a, is likely to be an oxide semiconductor film in an amorphous state (or an oxide semiconductor film which is almost in an amorphous state), because impurities are added thereto.

An oxide semiconductor film in an amorphous state (or an oxide semiconductor film which is almost in an amorphous state) easily absorbs impurities such as hydrogen which serves as a donor from an oxide semiconductor film having crystallinity such as a CAAC-OS film; thus, the impurities are absorbed (also referred to as gettered) from the channel formation region 108a to the low-resistance regions 108b and 108c, so that the electric characteristics of the transistor 150 can be improved.

One or more selected from the following can be used as the impurity 120: Group 15 elements (typified by nitrogen (N), phosphorus (P), arsenic (As), and antimony (Sb)), boron (B), aluminum (Al), argon (Ar), helium (He), neon (Ne), indium (In), fluorine (F), chlorine (Cl), titanium (Ti), and zinc (Zn). As a method for adding the impurity 120 to the oxide semiconductor film 108, an ion doping method or an ion implantation method can be used.

The treatment for adding the impurity 120 to the oxide semiconductor film 108 may be performed plural times. In the case where the treatment for adding the impurity 120 to the oxide semiconductor film 108 is performed plural times, the kind of the impurity 120 may be the same in the plural treatments or different in every treatment.

Figure 3D:
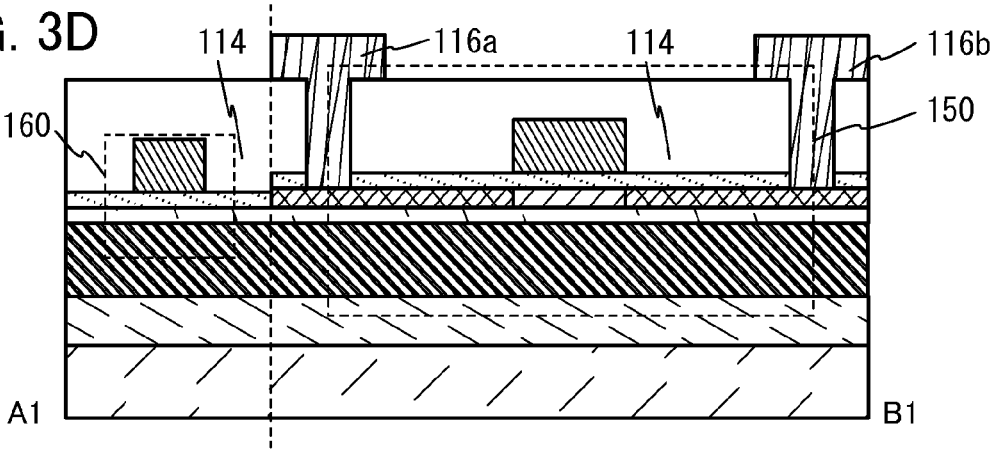

Next, the interlayer film 114 is formed over the gate electrode 112a, the upper electrode film 112b, the gate insulating film 110a, and the inter-electrode insulating film 110b, and the source electrode 116a and the drain electrode 116b are formed over the interlayer film 114 to be electrically connected to the low-resistance region 108b and the low-resistance region 108c of the oxide semiconductor film 108, respectively, through openings provided in the gate insulating film 110a and the interlayer film 114 (see FIG. 3D).

The interlayer film 114 can be formed using silicon oxide, gallium oxide, aluminum oxide, zirconium oxide, yttrium oxide, hafnium oxide, lanthanum oxide, neodymium oxide, tantalum oxide, silicon nitride, silicon oxynitride, aluminum oxynitride, silicon nitride oxide, or the like. The interlayer film 114 may have either a single-layer structure or a stacked-layer structure. Similarly to the gate insulating film 106a and the like, the interlayer film 114 may be formed using an insulating oxide from which part of oxygen is released by heating.

The source electrode 116a and the drain electrode 116b may be regioselectively formed in such a manner that, for example, a conductive film (e.g., a metal film or a silicon film to which an impurity element imparting one conductivity type is added) is formed by a sputtering method, an etching mask is formed over the conductive film, and etching is performed. Alternatively, an inkjet method or the like may be used. Note that the conductive film to be the source electrode 116a and the drain electrode 116b may be formed with a single layer or a plurality of stacked layers. For example, the conductive film may be formed with a three-layer structure in which an Al layer is sandwiched between Ti layers.

In this manner, the transistor 150 and the capacitor 160 can be manufactured.

As described above, a region which is less likely to be acted upon by an electric field of the gate electrode 112a, which functions as a front gate electrode, can be controlled by an electric field of the gate electrode 104a, which functions as a back gate electrode; thus, a variation in electrical characteristics, such as a negative shift of the threshold voltage or an increase in S value, can be prevented. Further, the on-state current of the transistor can be increased owing to the electric field of the back gate electrode. Moreover, the oxide semiconductor film 108 is sandwiched between the gate electrode 104a and the gate electrode 112a with the gate insulating film 106a provided between the oxide semiconductor film 108 and the gate electrode 104a and the gate insulating film 110a provided between the oxide semiconductor film 108 and the gate electrode 112a. With this structure, application of a gate field to the oxide semiconductor film 108 can be controlled in plural directions. This makes it possible to control the on/off of, for example, even a transistor which includes an oxide semiconductor film with a high carrier concentration of $1 \times 10^{17}/cm^3$ or more and whose on/off thus has not been able to be controlled.

Accordingly, it is possible to provide a transistor which has favorable transistor characteristics and includes an oxide semiconductor, and to provide a highly reliable semiconductor device which includes the transistor including the oxide semiconductor. In addition, the transistor and the capacitor can be formed through the same process; therefore, the capacitor can be efficiently formed.

The structures, methods, and the like described in this embodiment can be combined as appropriate with any of the structures, methods, and the like described in the other embodiments.

Embodiment 2

In this embodiment, one embodiment of a structure of a semiconductor device whose structure is different from that described in Embodiment 1 and a method for manufacturing the semiconductor device will be described with reference to FIGS. 4A to 4C, FIGS. 5A to 5D and FIG. 6.

<Example of Structure of Semiconductor Device>

Figure 4A:
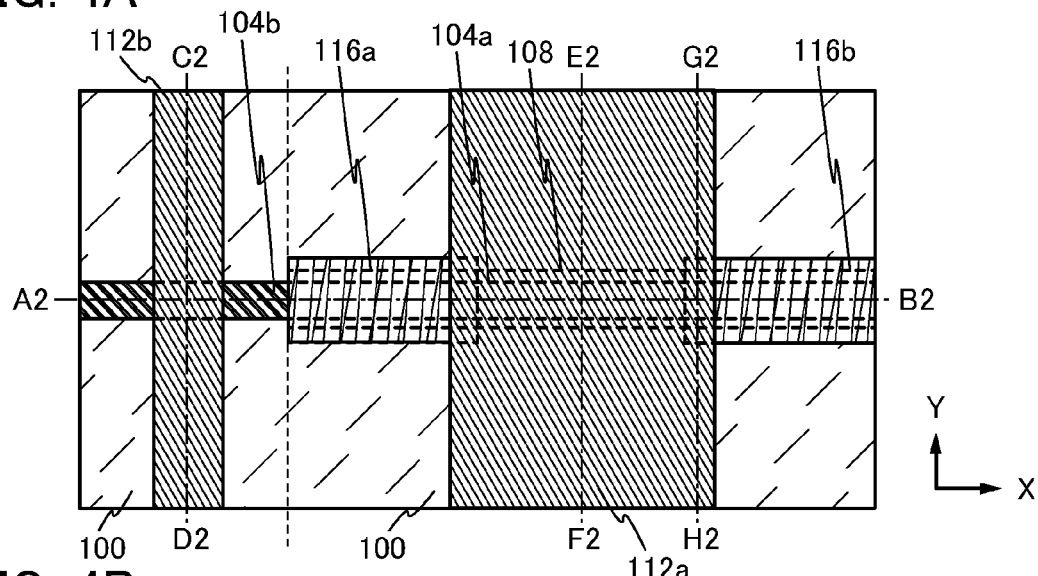
FIGS. 4A to 4C are a top view and cross-sectional views which illustrate one embodiment of a semiconductor device.
Figure 4B:
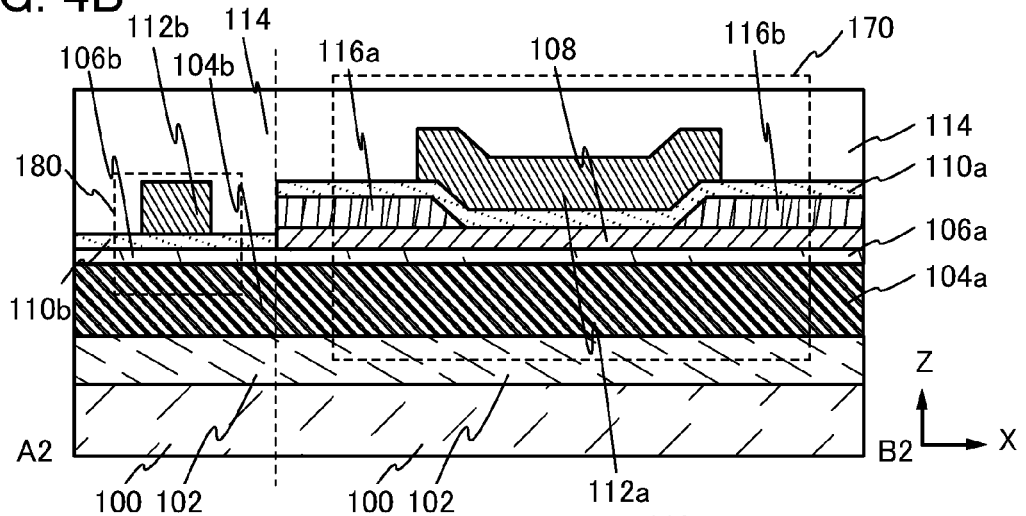
Figure 4C:
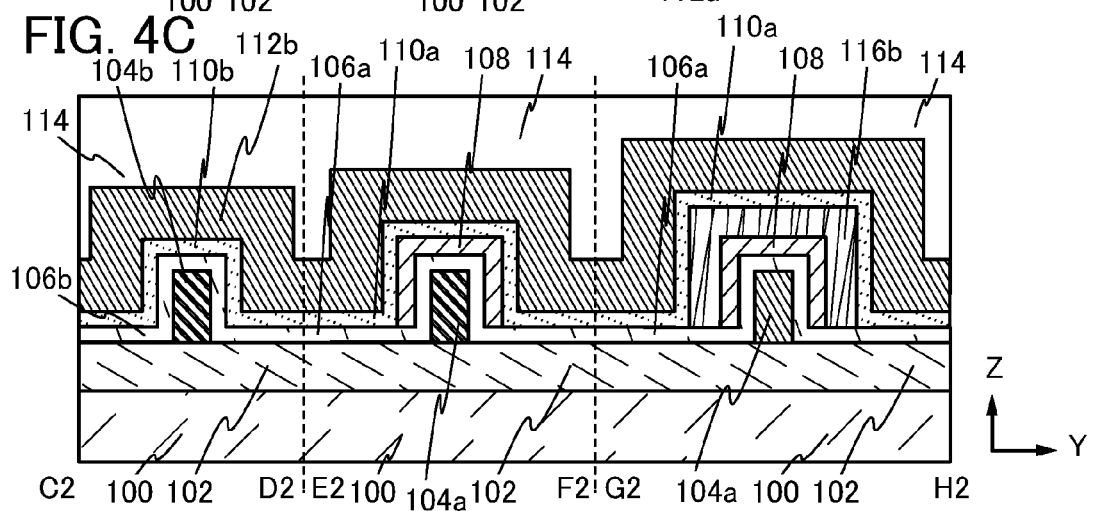

FIGS. 4A to 4C show an example of a top view and cross-sectional views of a semiconductor device including a top-gate transistor 170 and a capacitor 180. FIG. 4A is a top view, FIG. 4B is a cross-sectional view taken along a dashed-dotted line A2-B2 in FIG. 4A, and FIG. 4C is a cross-sectional view taken along a dashed-dotted line C2-D2, a dashed-dotted line E2-F2, and a dashed-dotted line G2-H2 in FIG. 4A.

The transistor 170 illustrated in FIGS. 4A to 4C includes the base insulating film 102 over the substrate 100 having an insulating surface, the gate electrode 104a over the base insulating film 102, the gate insulating film 106a covering the gate electrode 104a, the oxide semiconductor film 108 provided to be in contact with the gate insulating film 106a and extend beyond the gate electrode 104a, the source electrode 116a and the drain electrode 116b provided to be in contact with the oxide semiconductor film 108 and extend beyond the gate electrode 104a, the gate insulating film 110a covering at least the oxide semiconductor film 108, the source electrode 116a, and the drain electrode 116b, the gate electrode 112a provided to be in contact with part of the gate insulating film 110a and extend beyond the gate electrode 104a, and the interlayer film 114 over the gate insulating film 110a and the gate electrode 112a. The gate electrode 112a overlaps with part of the source electrode 116a and part of the drain electrode 116b.

When the oxide semiconductor film 108 is seen from a direction perpendicular to a surface of the base insulating film 102 or a surface where the base insulating film 102 is formed as illustrated in FIG. 4A, the channel length direction of the oxide semiconductor film 108 and the channel width direction thereof may be referred to as an X-axis direction (or A2-B2 direction) and a Y-axis direction (or E2-F2 direction), respectively. In addition, a direction perpendicular to an X-Y plane may be referred to as a Z-axis direction.

In this embodiment, the gate electrode 104a extends in the X-axis direction and the gate electrode 112a extends in the Y-axis direction.

In the transistor 170, a region which is less likely to be acted upon by an electric field of the gate electrode 112a, which functions as a front gate electrode, can be controlled by an electric field of the gate electrode 104a, which functions as a back gate electrode; thus, a variation in electrical characteristics, such as a negative shift of the threshold voltage or an increase in S value, can be prevented. Further, the on-state current of the transistor 170 can be increased owing to the electric field of the back gate electrode. In addition, the structure in which the gate electrode 112a overlaps with part of the source electrode 116a and part of the drain electrode 116b enables the external resistance of the transistor 170 to be reduced, so that a decrease in on-state current can be suppressed.

Further, the capacitor 180 illustrated in FIGS. 4A to 4C includes the lower electrode film 104b, the upper electrode film 112b, and the inter-electrode insulating film 106b and the inter-electrode insulating film 110b which are sandwiched between the lower electrode film 104b and the upper electrode film 112b.

<Method for Manufacturing Semiconductor Device>

An example of a manufacturing process of the semiconductor device illustrated in FIGS. 4A to 4C is described with reference to FIGS. 5A to 5D.

First, the substrate 100 having an insulating surface is prepared, and the base insulating film 102 is formed over the substrate 100. Next, a conductive film to be the gate electrode 104a and the lower electrode film 104b is formed over the base insulating film 102, a mask is formed over the conductive film by a photolithography method or the like, and part of the conductive film is regioselectively removed with the mask, so that the gate electrode 104a and the lower electrode film 104b are formed by patterning. Next, an insulating film to be the gate insulating film 106a and the inter-electrode insulating film 106b is formed to cover the gate electrode 104a and the lower electrode film 104b, a mask is formed over the insulating film by a photolithography method or the like, and part of the insulating film is regioselectively removed with the mask, so that the gate insulating film 106a and the inter-electrode insulating film 106b are formed. Next, the oxide semiconductor film 108 is formed to be in contact with the gate insulating film 106a and extend beyond the gate electrode 104a (see FIGS. 2A to 2D).

In forming the gate electrode 104a and the lower electrode film 104b by patterning, by increasing the aspect ratio (in this embodiment, the ratio of the height to the base) of the patterned conductive film, the capacitance of the capacitor 180 can be increased as compared with the case of a planar conductive film (i.e., a conductive film whose base is long).

Embodiment 1 can be referred to for materials, methods, and the like used for forming the substrate 100, the base insulating film 102, the gate electrode 104a, the lower electrode film 104b, the gate insulating film 106a, the inter-electrode insulating film 106b, and the oxide semiconductor film 108.

Figure 5A:
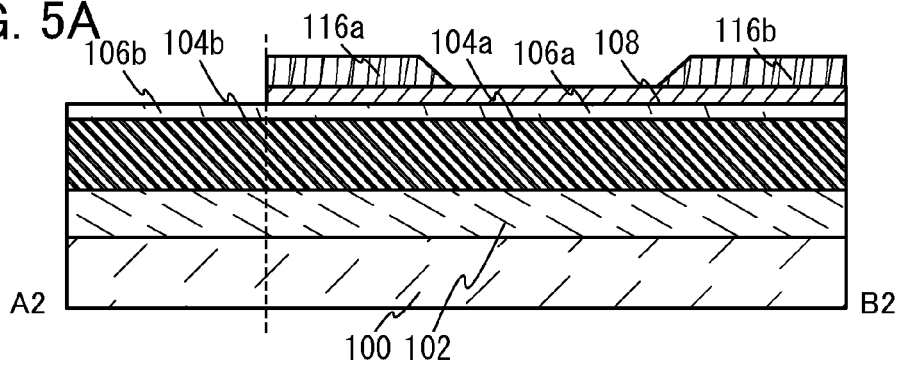
FIGS. 5A to 5D illustrate one embodiment of a method for manufacturing a semiconductor device.

Next, the source electrode 116a and the drain electrode 116b are formed to be in contact with part of the oxide semiconductor film 108 and extend beyond the gate electrode 104a (see FIG. 5A).

Embodiment 1 can be referred to for a material, a method, and the like used for forming the source electrode 116a and the drain electrode 116b.

Figure 5B:
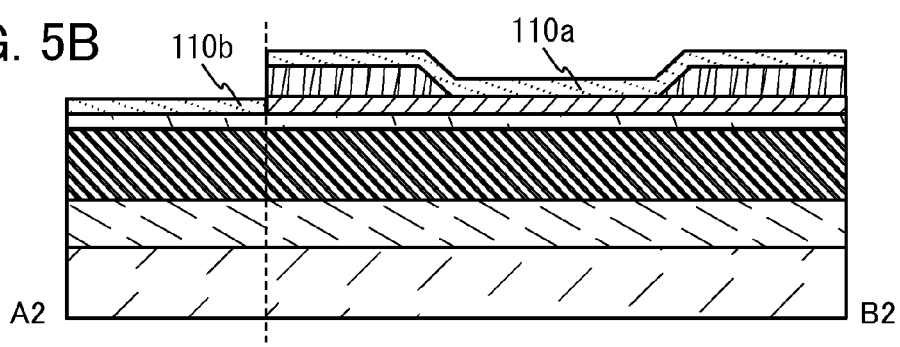

Next, an insulating film to be the gate insulating film 110a and the inter-electrode insulating film 110b is formed to cover at least the oxide semiconductor film 108, the source electrode 116a, the drain electrode 116b, and the inter-electrode insulating film 106b and etching is performed, whereby the gate insulating film 110a and the inter-electrode insulating film 110b are formed (see FIG. 5B).

Embodiment 1 can be referred to for a material, a method, and the like used for forming the gate insulating film 110a and the inter-electrode insulating film 110b.

Figure 5C:
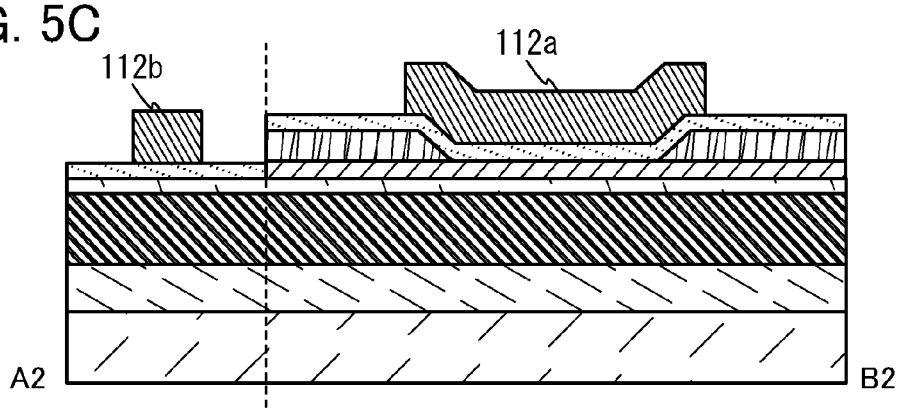

Next, a conductive film to be the gate electrode 112a and the upper electrode film 112b is formed, a mask is formed over the conductive film by a photolithography method or the like, and part of the conductive film is regioselectively removed with the mask, so that the conductive film is patterned so as to extend beyond the gate electrode 104a and the lower electrode film 104b (see FIG. 5C).

The patterned conductive film functions as the gate electrode 112a in the transistor 170 and functions as the upper electrode film 112b in the capacitor 180. The gate electrode 112a overlaps with part of the source electrode 116a and part of the drain electrode 116b.

Embodiment 1 can be referred to for a material, a method, and the like used for forming the gate electrode 112a and the upper electrode film 112b.

The following structure may also be employed: the inter-electrode insulating film 110b is not provided, and instead of the upper electrode film 112b, an upper electrode film is formed in the same layer as the conductive film to be the source electrode 116a and the drain electrode 116b.

The oxide semiconductor film 108 is sandwiched between the gate electrode 104a and the gate electrode 112a with the gate insulating film 106a provided between the oxide semiconductor film 108 and the gate electrode 104a and the gate insulating film 110a provided between the oxide semiconductor film 108 and the gate electrode 112a. With this structure, application of a gate field to the oxide semiconductor film 108 can be controlled in plural directions. This makes it possible to control the on/off of, for example, even a transistor which includes an oxide semiconductor film with a high carrier concentration of $1 \times 10^{17}/cm^3$ or more and whose on/off thus has not been able to be controlled.

Figure 5D:
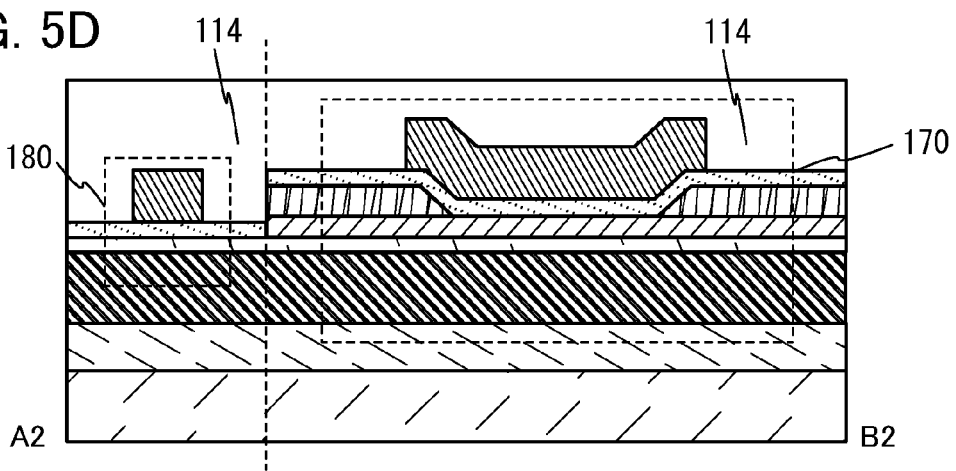

Next, the interlayer film 114 is formed over the gate electrode 112a, the upper electrode film 112b, the gate insulating film 110a, and the inter-electrode insulating film 110b (see FIG. 5D).

Embodiment 1 can be referred to for a material, a method, and the like used for forming the interlayer film 114.

In this manner, the transistor 170 and the capacitor 180 can be manufactured.

Figure 6:
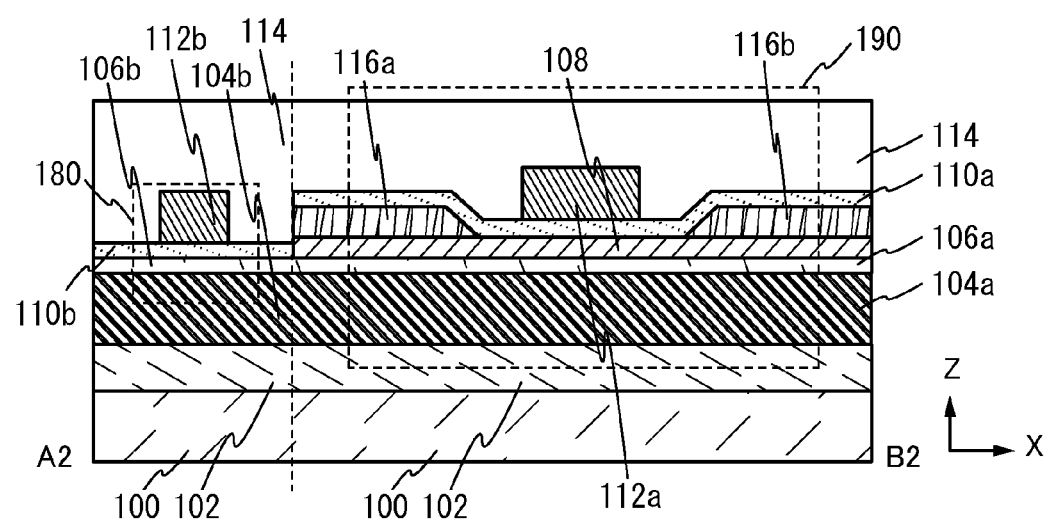
FIG. 6 is a cross-sectional view illustrating one embodiment of a semiconductor device.

As in a transistor 190 illustrated in FIG. 6, when the conductive film is patterned (the step in FIG. 5C) so that the gate electrode 112a does not overlap with the source electrode 116a or the drain electrode 116b with the gate insulating film 110a provided therebetween, the parasitic capacitance between the gate electrode 112a and the source electrode 116a and between the gate electrode 112a and the drain electrode 116b can be reduced.

As described above, a region which is less likely to be acted upon by an electric field of the gate electrode 112a, which functions as a front gate electrode, can be controlled by an electric field of the gate electrode 104a, which functions as a back gate electrode; thus, a variation in electrical characteristics, such as a negative shift of the threshold voltage or an increase in S value, can be prevented. Further, the on-state current of the transistor can be increased owing to the electric field of the back gate electrode. Moreover, the oxide semiconductor film 108 is sandwiched between the gate electrode 104a and the gate electrode 112a with the gate insulating film 106a provided between the oxide semiconductor film 108 and the gate electrode 104a and the gate insulating film 110a provided between the oxide semiconductor film 108 and the gate electrode 112a. With this structure, application of a gate field to the oxide semiconductor film 108 can be controlled in plural directions. This makes it possible to control the on/off of, for example, even a transistor which includes an oxide semiconductor film with a high carrier concentration of $1 \times 10^{17}/cm^3$ or more and whose on/off thus has not been able to be controlled.

Accordingly, it is possible to provide a transistor which has favorable transistor characteristics and includes an oxide semiconductor, and to provide a highly reliable semiconductor device which includes the transistor including the oxide semiconductor. In addition, the transistor and the capacitor can be formed through the same process; therefore, the capacitor can be efficiently formed.

The structures, methods, and the like described in this embodiment can be combined as appropriate with any of the structures, methods, and the like described in the other embodiments.

Embodiment 3

In this embodiment, an example of a semiconductor device which includes the semiconductor device described in Embodiment 1 or 2, which can hold stored data even when not powered, and which does not have a limitation on the number of write cycles will be described with reference to the drawings.

Figure 7A:
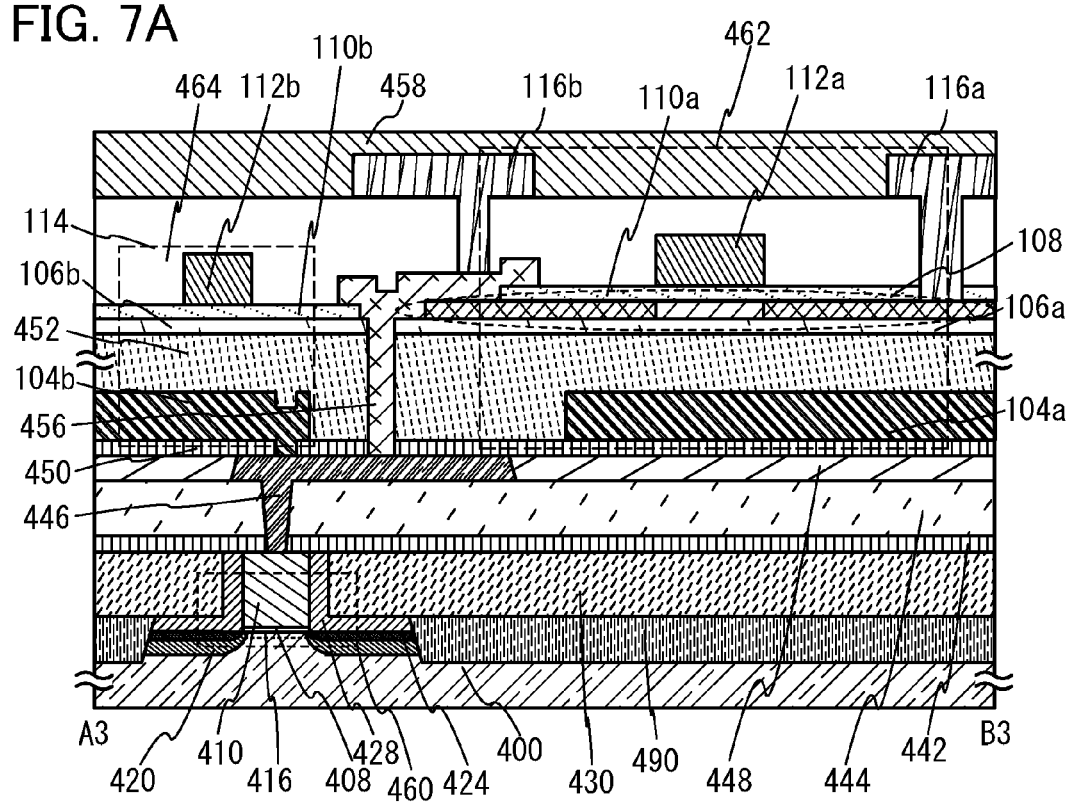
FIGS. 7A to 7C are a cross-sectional view, a top view, and a circuit diagram which illustrate one embodiment of a semiconductor device.
Figure 7B:
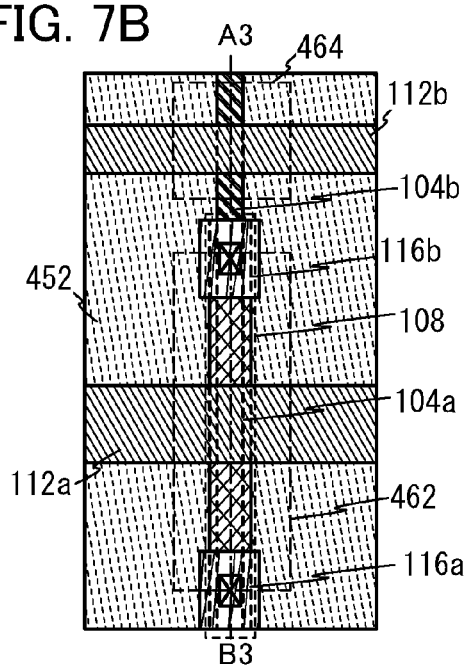
Figure 7C:
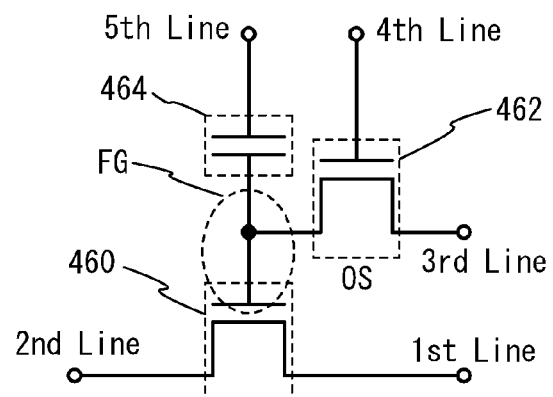

FIGS. 7A to 7C illustrate an example of a structure of a semiconductor device. FIG. 7A is a cross-sectional view of the semiconductor device, FIG. 7B is a top view of the semiconductor device, and FIG. 7C is a circuit diagram of the semiconductor device. Here, FIG. 7A corresponds to a cross section along line A3-B3 in FIG. 7B.

The semiconductor device illustrated in FIGS. 7A and 7B includes a transistor 460 including a first semiconductor material in a lower layer, and a transistor 462 including a second semiconductor material and a capacitor 464 manufactured through the same process as the transistor 462 in an upper layer. In this embodiment, the transistor 150 and the capacitor 160 in Embodiment 1 are used as the transistor 462 and the capacitor 464, respectively; however, the structures of the transistor and the capacitor described in Embodiment 2 may be used.

Here, the first semiconductor material and the second semiconductor material are preferably materials having different band gaps. For example, the second semiconductor material may be a semiconductor material other than an oxide semiconductor (e.g., a silicon-based semiconductor material and a compound-based semiconductor material) and the first semiconductor material may be an oxide semiconductor. A transistor including a material other than an oxide semiconductor can operate at high speed easily. A transistor including an oxide semiconductor enables charge to be held for a long time owing to its characteristics.

Although all the transistors are n-channel transistors here, it is needless to say that p-channel transistors can be used. In addition, details of the semiconductor device, such as materials for the semiconductor device and the structure of the semiconductor device, are not necessarily limited to those described here.

The transistor 460 includes, as illustrated in FIG. 7A, a channel formation region 416 provided in a substrate 400 containing a semiconductor material other than an oxide semiconductor (for example, silicon, germanium, or a compound semiconductor material such as GaAs, InP, SiC, ZnSe, GaN, and SiGe, can be used), impurity regions 420 with the channel formation region 416 sandwiched therebetween, intermetallic compound regions 424 in contact with the impurity regions 420, a gate insulating film 408 over the channel formation region 416, and a gate electrode 410 over the gate insulating film 408. Note that a transistor whose source electrode and drain electrode are not illustrated in a drawing may be referred to as a transistor for the sake of convenience. Further, in such a case, in description of a connection of a transistor, a source region and a source electrode are collectively referred to as a "source electrode", and a drain region and a drain electrode are collectively referred to as a "drain electrode". That is, in this specification, the term "source electrode" may include a source region. Note that semiconductor elements provided in the layer including the transistor 460 are separated by a partition 490.

An insulating film 428 and an insulating film 430 are provided so as to cover the transistor 460 over the substrate 400. Note that in the transistor 460, sidewall insulating films may be formed on side surfaces of the gate electrode 410, and the impurity regions 420 may include regions having different impurity concentrations.

The transistor 460 formed using a single crystal semiconductor substrate can operate at high speed. Thus, when the transistor is used as a reading transistor, data can be read at a high speed. Two insulating films are formed so as to cover the transistor 460. As pretreatment for forming the transistor 462 and the capacitor 464 over the insulating film 428 and the insulating film 430, the insulating film 428 and the insulating film 430 are subjected to removal treatment (e.g., CMP treatment), so that the insulating film 428 and the insulating film 430 are planarized and the top surface of the gate electrode 410 is exposed.

As the insulating film 428 and the insulating film 430, an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film can be typically used. The insulating film 428 and the insulating film 430 can be formed by a plasma CVD method, a sputtering method, or the like.

Alternatively, an organic material such as polyimide, an acrylic resin, or a benzocyclobutene-based resin can be used. Other than such organic materials, it is also possible to use a low-dielectric constant material (a low-k material) or the like. In the case of using an organic material, the insulating film 428 and the insulating film 430 may be formed by a wet method such as a spin coating method or a printing method.

Note that in this embodiment, a silicon nitride film is used as the insulating film 428, and a silicon oxide film is used as the insulating film 430.

In this embodiment, a first interlayer film 442 and a second interlayer film 444 are formed over the insulating film 428 and the insulating film 430 which are sufficiently planarized (the average surface roughness of each of the insulating film 428 and the insulating film 430 is preferably less than or equal to 0.15 nm) by removal treatment (e.g., CMP treatment). The first interlayer film 442 and the second interlayer film 444 can be formed using a method and a material similar to those of the base insulating film 102 in Embodiment 1.

Further, a wiring 446 electrically connected to the gate electrode 410 through an opening formed in the first interlayer film 442 and the second interlayer film 444 is provided over the second interlayer film 444, and a third interlayer film 448 functioning as a planarization film which planarizes a step caused by the formation of the wiring 446 is provided. The wiring 446 can be formed using a method and a material similar to those of the source electrode 116a and the drain electrode 116b described in Embodiment 1. Further, the third interlayer film 448 can be formed using a method and a material similar to those of the interlayer film 114 described in Embodiment 1.

Further, a fourth interlayer film 450 having a function of suppressing a transfer of impurities which are likely to affect the characteristics of the transistor between the lower layer (the layer including the transistor 460) and the upper layer (the layer including the transistor 462) is provided over the third interlayer film 448, and the gate electrode 104a of the transistor 462 and the lower electrode film 104b of the capacitor 464 are provided over the fourth interlayer film 450. Over the fourth interlayer film 450, the gate electrode 104a, and the lower electrode film 104b, a base insulating film 452 having a function of supplying oxygen to the oxide semiconductor film 108 of the transistor 462 is provided. A barrier film for preventing copper or aluminum from reaching the oxide semiconductor film 108 is preferably formed as the fourth interlayer film 450. As a barrier film for blocking transfer of copper or aluminum, a tantalum nitride film, a tungsten film, a tungsten nitride film, a molybdenum film, a molybdenum nitride film, a titanium film, a titanium nitride film, a chromium film, or a chromium nitride film can be given. Further, the base insulating film 452 can be formed using a method and a material similar to those of the base insulating film 102 described in Embodiment 1.

In addition, a wiring 456 which is electrically connected to the drain electrode 116b of the transistor 462 is electrically connected to the wiring 446 through an opening provided in the inter-electrode insulating film 110b, the inter-electrode insulating film 106b, the fourth interlayer film 450, and the base insulating film 452. The wiring 446 is electrically connected to the lower electrode film 104b of the capacitor 464. The source electrode 116a and the drain electrode 116b are provided over the interlayer film 114, and a protective film 458 is provided over the source electrode 116a and the drain electrode 116b. The protective film 458 may be formed using a method and a material similar to those of the interlayer film 114. Note that Embodiment 1 can be referred to for the structures and components of the transistor and the capacitor in this embodiment.

The transistor 462 illustrated in FIG. 7A includes an oxide semiconductor material in the channel formation region. Here, the oxide semiconductor film 108 included in the transistor 462 is preferably highly purified by removing impurities such as moisture and hydrogen as much as possible, as described in the above embodiment. Further, the oxide semiconductor film in which oxygen vacancies are sufficiently filled is preferable. By using such an oxide semiconductor film, the off-state current of the transistor 462 can be made extremely small.

Since the off-state current of the transistor 462 is extremely small, stored data can be held for a long time owing to such a transistor. In other words, refresh operation becomes unnecessary or the frequency of the refresh operation in the semiconductor device can be extremely lowered, which leads to a sufficient reduction in power consumption.

In FIGS. 7A and 7B, the transistor 460 and the transistor 462 are provided to overlap with each other at least partly. The source region or the drain region of the transistor 460 is preferably provided to overlap with part of the oxide semiconductor film 108. In addition, the transistor 460 and the capacitor 464 are preferably provided to overlap with each other. For example, the lower electrode film 104b and the upper electrode film 112b of the capacitor 464 overlap with the transistor 460 at least partly. With such a planar layout, the area occupied by the semiconductor device can be reduced; thus, higher integration can be achieved.

Note that in this embodiment, the gate electrode 410 of the transistor 460 is electrically connected to the drain electrode 116b of the transistor 462 through the wiring 446 and the wiring 456; however, they may be directly connected to each other. Further, in this embodiment, the first to fourth interlayer films 442, 444, 448, and 450 and the base insulating film 452 are provided between the layer including the transistor 460 and the layer including the transistor 462; however, not all films are needed, and a practitioner may appropriately select which of the films to form in terms of characteristics needed for the semiconductor device, reliability, cost, and the like.

FIG. 7C illustrates an example of a circuit configuration corresponding to FIGS. 7A and 7B.

In FIG. 7C, a first wiring (1st Line) is electrically connected to a source electrode of the transistor 460. A second wiring (2nd Line) is electrically connected to a drain electrode of the transistor 460. A third wiring (3rd Line) is electrically connected to the source electrode (or the drain electrode) of the transistor 462. A fourth wiring (4th Line) is electrically connected to the gate electrode of the transistor 462. The gate electrode of the transistor 460 and the drain electrode (or the source electrode) of the transistor 462 are electrically connected to one electrode of the capacitor 464. A fifth wiring (5th line) is electrically connected to the other electrode of the capacitor 464.

The semiconductor device in FIG. 7C utilizes a characteristic in which the potential of the gate electrode of the transistor 460 can be held, and thus enables data writing, holding, and reading as follows. Since the transistor 460 includes an oxide semiconductor (OS) in its active layer (also referred to as a channel formation region), the symbol "OS" is placed beside the circuit symbol of the transistor. The above-described meaning also applies to a transistor indicated by "OS" in another drawing which is used for description in this specification.

Writing and holding of data will be described. First, the potential of the fourth wiring is set to a potential at which the transistor 462 is turned on, so that the transistor 462 is turned on. Thus, the potential of the third wiring is supplied to the gate electrode of the transistor 460 and the capacitor 464. That is, predetermined charge is given to the gate electrode of the transistor 460 (writing). Here, charge for supplying either of two different potential levels (hereinafter referred to as low-level charge and high-level charge) is given. After that, the potential of the fourth wiring is set to a potential at which the transistor 462 is turned off, so that the transistor 462 is turned off. Thus, the charge given to the gate electrode of the transistor 460 is held (holding).

Since the off-state current of the transistor 462 is significantly small, the charge of the gate electrode of the transistor 460 is held for a long time.

Next, reading of data will be described. By supplying an appropriate potential (reading potential) to the fifth wiring while a predetermined potential (constant potential) is supplied to the first wiring, the potential of the second wiring varies depending on the amount of charge held in the gate electrode of the transistor 460. This is because in general, when the transistor 460 is an n-channel transistor, an apparent threshold voltage $V_{th\_H}$ in the case where a high-level charge is given to the gate electrode of the transistor 460 is lower than an apparent threshold voltage $V_{th\_L}$ in the case where a low-level charge is given to the gate electrode of the transistor 460. Here, an apparent threshold voltage refers to the potential of the fifth wiring, which is needed to turn on the transistor 460. Thus, the potential of the fifth wiring is set to a potential $V_0$ that is between $V_{th\_H}$ and $V_{th\_L}$, whereby charge given to the gate electrode of the transistor 460 can be determined. For example, in the case where a high-level charge is given in writing, when the potential of the fifth wiring is set to $V_0$ ($>V_{th\_H}$), the transistor 460 is turned on. In the case where a low-level charge is given in writing, even when the potential of the fifth wiring is set to $V_0$ ($<V_{th\_L}$), the transistor 460 remains in an off state. Therefore, the data held can be read by the potential of the second wiring.

Note that in the case where memory cells are arrayed, only data of desired memory cells needs to be read. In the case where data is not read, a potential at which the transistor 460 is turned off regardless of the state of the gate electrode, that is, a potential lower than $V_{th\_H}$ may be supplied to the fifth wiring. Alternatively, a potential at which the transistor 460 is turned on regardless of the state of the gate electrode, that is, a potential higher than $V_{th\_L}$ may be supplied to the fifth wiring.

When a transistor having a channel formation region formed using an oxide semiconductor and having extremely small off-state current is applied to the semiconductor device in this embodiment, the semiconductor device can hold data for an extremely long period. In other words, power consumption can be sufficiently reduced because refresh operation becomes unnecessary or the frequency of refresh operation can be extremely low. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating film does not occur at all. In other words, the semiconductor device according to one embodiment of the disclosed invention does not have a limit on the number of write cycles, which is a problem in a conventional nonvolatile memory, and reliability thereof is drastically improved. Furthermore, since data is written depending on the on state and the off state of the transistor, high-speed operation can be easily achieved.

As described above, a region which is less likely to be acted upon by an electric field of the gate electrode 112a, which functions as a front gate electrode, can be controlled by an electric field of the gate electrode 104a, which functions as a back gate electrode; thus, a variation in electrical characteristics, such as a negative shift of the threshold voltage or an increase in S value, can be prevented. Further, the on-state current of the transistor can be increased owing to the electric field of the back gate electrode. Moreover, the oxide semiconductor film 108 is sandwiched between the gate electrode 104a and the gate electrode 112a with the gate insulating film 106a provided between the oxide semiconductor film 108 and the gate electrode 104a and the gate insulating film 110a provided between the oxide semiconductor film 108 and the gate electrode 112a. With this structure, application of a gate field to the oxide semiconductor film 108 can be controlled in plural directions. This makes it possible to control the on/off of, for example, even a transistor which includes an oxide semiconductor film with a high carrier concentration of $1 \times 10^{17}/cm^3$ or more and whose on/off thus has not been able to be controlled.

Moreover, a miniaturized and highly-integrated semiconductor device having high electric characteristics and a method for manufacturing the semiconductor device can be provided.

The structures, methods, and the like described in this embodiment can be combined as appropriate with any of the structures, methods, and the like described in the other embodiments.

Embodiment 4

In this embodiment, a semiconductor device which includes the semiconductor device described in Embodiment 1 or 2, which can hold stored data even when not powered, which does not have a limitation on the number of write cycles, and which has a structure different from the structure described in Embodiment 3 is described with reference to FIGS. 8A and 8B and FIGS. 9A and 9B.

Figure 8A:
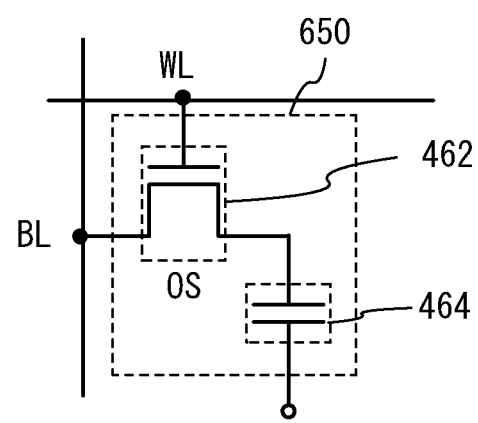
FIGS. 8A and 8B are a circuit diagram and a perspective view which illustrate one embodiment of a semiconductor device.
Figure 8B:
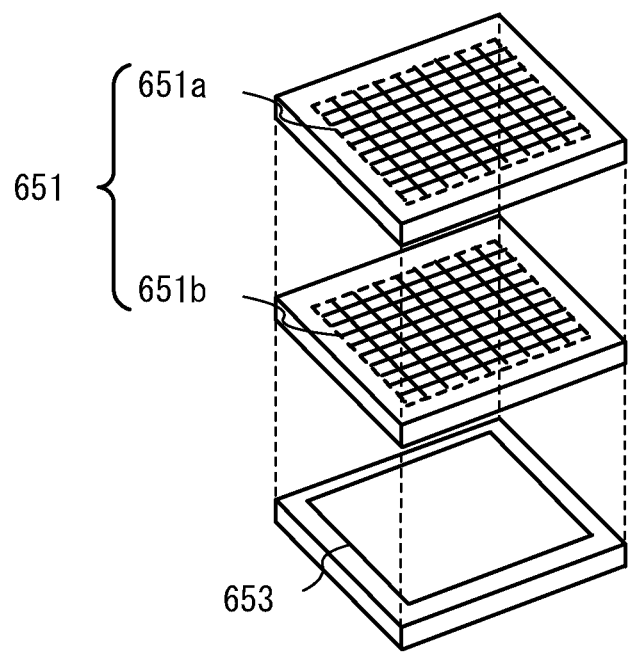

FIG. 8A illustrates an example of a circuit configuration of a semiconductor device, and FIG. 8B is a conceptual diagram illustrating an example of a semiconductor device. First, the semiconductor device illustrated in FIG. 8A will be described, and then, the semiconductor device illustrated in FIG. 8B will be described.

In the semiconductor device illustrated in FIG. 8A, a bit line BL is electrically connected to the source electrode or the drain electrode of the transistor 462, a word line WL is electrically connected to the gate electrode of the transistor 462, and the source electrode or the drain electrode of the transistor 462 is electrically connected to a first terminal of the capacitor 464.

Next, writing and holding of data in the semiconductor device (a memory cell 650) illustrated in FIG. 8A are described.

First, the potential of the word line WL is set to a potential at which the transistor 462 is turned on, so that the transistor 462 is turned on. Thus, the potential of the bit line BL is supplied to the first terminal of the capacitor 464 (writing). After that, the potential of the word line WL is set to a potential at which the transistor 462 is turned off, so that the transistor 462 is turned off. Thus, the potential of the first terminal of the capacitor 464 is held (holding).

The transistor 462 including an oxide semiconductor has significantly small off-state current. For that reason, a potential of the first terminal of the capacitor 464 (or charge accumulated in the capacitor 464) can be held for an extremely long time by turning off the transistor 462.

Next, reading of data is described. When the transistor 462 is turned on, the bit line BL which is in a floating state and the capacitor 464 are electrically connected to each other, and the charge is redistributed between the bit line BL and the capacitor 464. As a result, the potential of the bit line BL is changed. The amount of change in potential of the bit line BL varies depending on the potential of the first terminal of the capacitor 464 (or the charge accumulated in the capacitor 464).

For example, the potential of the bit line BL after charge redistribution is $(C_B \times V_{B0}+C+V)/(C_B+C)$, where V is the potential of the first terminal of the capacitor 464, C is the capacitance of the capacitor 464, $C_B$ is the capacitance of the bit line BL (hereinafter also referred to as a bit line capacitance), and $V_{B0}$ is the potential of the bit line BL before the charge redistribution. Therefore, it can be found that assuming that the memory cell 650 is in either of two states in which the potentials of the first terminal of the capacitor 464 are $V_1$ and $V_0$ ($V_1 > V_0$), the potential of the bit line BL in the case of holding the potential $V_1$ ($=(C_B \times V_{B0}+C \times V_1)/(C_B+C)$) is higher than the potential of the bit line BL in the case of holding the potential $V_0$ ($=(C_B \times V_{B0}+C \times V_0)/(C_B+C)$).

Then, by comparing the potential of the bit line BL with a predetermined potential, data can be read.

As described above, the semiconductor device illustrated in FIG. 8A can hold charge that is accumulated in the capacitor 464 for a long time because the off-state current of the transistor 462 is extremely small. In other words, power consumption can be sufficiently reduced because refresh operation becomes unnecessary or the frequency of refresh operation can be extremely low. Moreover, stored data can be held for a long time even when power is not supplied.

Next, the semiconductor device illustrated in FIG. 8B will be described.

The semiconductor device illustrated in FIG. 8B includes memory cell arrays 651a and 651b each including a plurality of memory cells 650 illustrated in FIG. 8A as memory circuits in the upper portion, and a peripheral circuit 653 in the lower portion which is necessary for operating memory cell arrays 651 (the memory cell arrays 651a and 651b). Note that the peripheral circuit 653 is electrically connected to the memory cell arrays 651. With such a circuit structure, the semiconductor device can be reduced in size.

It is preferable that a semiconductor material of the transistor provided in the peripheral circuit 653 be different from that of the transistor 462. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Thus, the transistor enables a variety of circuits (e.g., a logic circuit and a driver circuit) which need to operate at high speed to be favorably obtained.

Note that FIG. 8B illustrates, as an example, the semiconductor device in which two memory cell arrays 651 (the memory cell arrays 651a and 651b) are stacked; however, the number of stacked memory cell arrays is not limited thereto. Three or more memory cell arrays may be stacked.

Next, a specific structure of the memory cell 650 illustrated in FIG. 8A will be described with reference to FIGS. 9A and 9B.

Figure 9A:
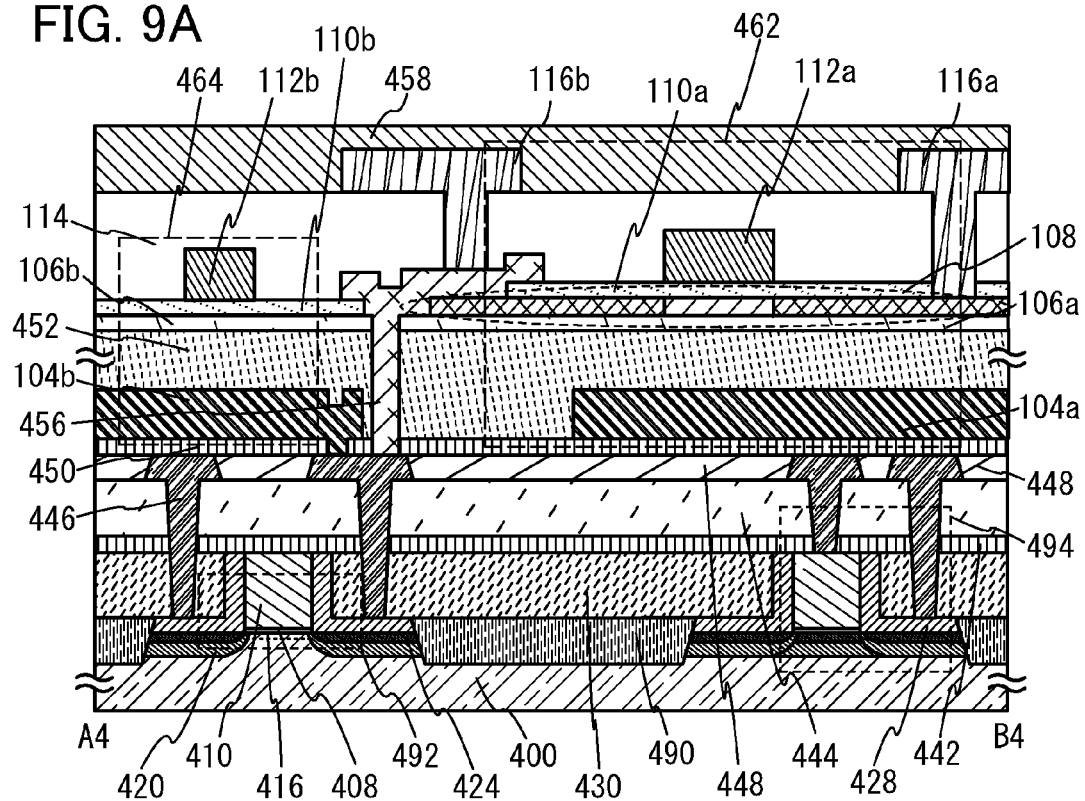
FIGS. 9A and 9B are a cross-sectional view and a top view which illustrate one embodiment of a semiconductor device.
Figure 9B:
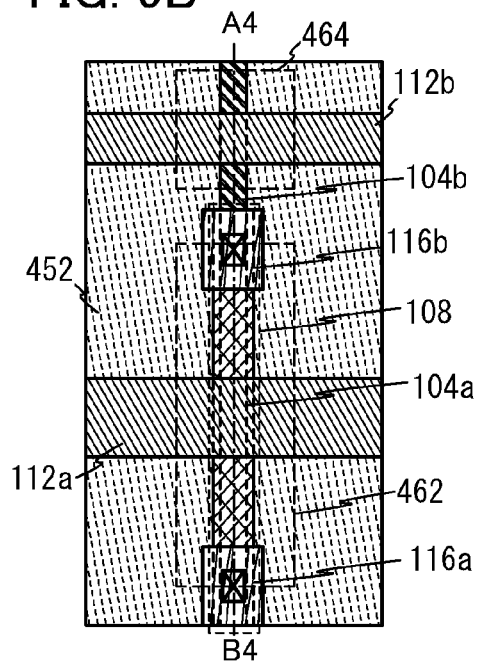

FIGS. 9A and 9B illustrate an example of a structure of the memory cell 650. FIG. 9A is a cross-sectional view of the memory cell 650, and FIG. 9B is a top view of the memory cell 650. Here, FIG. 9A corresponds to a cross section along line A4-B4 in FIG. 9B.

The transistor 462 provided over the base insulating film 452 can have a structure which is similar to the structure described in Embodiment 1 or Embodiment 3.

A semiconductor device illustrated in FIGS. 9A and 9B includes the transistor 462 including a second semiconductor material and the capacitor 464 manufactured through the same process as the transistor 462 in an upper layer. Further, the semiconductor device includes a transistor 492 including a first semiconductor material in a lower layer. In this embodiment, the transistor 150 and the capacitor 160 in Embodiment 1 are used as the transistor 462 and the capacitor 464, respectively; however, the structures of the transistor and the capacitor described in any of the other embodiments may be used.

The gate electrode 104a of the transistor 462, the gate insulating film 106a of the transistor 462, the gate insulating film 110a of the transistor 462, and the gate electrode 112a of the transistor 462 are formed using the same material and in the same step as the lower electrode film 104b of the capacitor 464, the inter-electrode insulating film 106b of the capacitor 464, the inter-electrode insulating film 110b of the capacitor 464, and the upper electrode film 112b of the capacitor 464, respectively. Further, the transistor 462 and the capacitor 464 are electrically connected to each other through the wiring 456.

The interlayer film 114 is provided over the transistor 462 and the capacitor 464, and the drain electrode 116b for connecting the memory cell 650 to the adjacent memory cell 650 is provided over the interlayer film 114. Note that the drain electrode 116b corresponds to the bit line BL in the circuit diagram of FIG. 8A.

With the planar layout illustrated in FIG. 9A, the area occupied by the semiconductor device can be reduced; thus, higher integration can be achieved.

As described above, the plurality of memory cells formed over the base insulating film 452 is each formed with a transistor including an oxide semiconductor. Since the off-state current of the transistor including an oxide semiconductor is small, stored data can be held for a long time owing to such a transistor. In other words, the frequency of refresh operation can be extremely lowered, which leads to a sufficient reduction in power consumption.

Note that as shown in FIG. 9A, a plurality of layers, such as a layer including the transistor 492, may be stacked under the layer including the transistor 462 as in Embodiment 3. For example, in FIG. 9A, a layer including the transistor 492 in which an active layer is formed using a single crystal semiconductor substrate and the capacitor 494 having a MOS structure is provided under the layer including the transistor 462. Note that semiconductor elements provided in the layer including the transistor 492 and the capacitor 494 having a MOS structure are separated by the partition 490.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor whose off-state current is sufficiently small). In addition, with a structure where the peripheral circuit and the memory circuit are stacked, the degree of integration of the semiconductor device can be increased.

As described above, a region which is less likely to be acted upon by an electric field of the gate electrode 112a, which functions as a front gate electrode, can be controlled by an electric field of the gate electrode 104a, which functions as a back gate electrode; thus, a variation in electrical characteristics, such as a negative shift of the threshold voltage or an increase in S value, can be prevented. Further, the on-state current of the transistor can be increased owing to the electric field of the back gate electrode. Moreover, the oxide semiconductor film 108 is sandwiched between the gate electrode 104a and the gate electrode 112a with the gate insulating film 106a provided between the oxide semiconductor film 108 and the gate electrode 104a and the gate insulating film 110a provided between the oxide semiconductor film 108 and the gate electrode 112a. With this structure, application of a gate field to the oxide semiconductor film 108 can be controlled in plural directions. This makes it possible to control the on/off of, for example, even a transistor which includes an oxide semiconductor film with a high carrier concentration of $1 \times 10^{17}/cm^3$ or more and whose on/off thus has not been able to be controlled.

Moreover, a miniaturized and highly-integrated semiconductor device having high electric characteristics and a method for manufacturing the semiconductor device can be provided.

The structures, methods, and the like described in this embodiment can be combined as appropriate with any of the structures, methods, and the like described in the other embodiments.

Embodiment 5

Figure 14A:
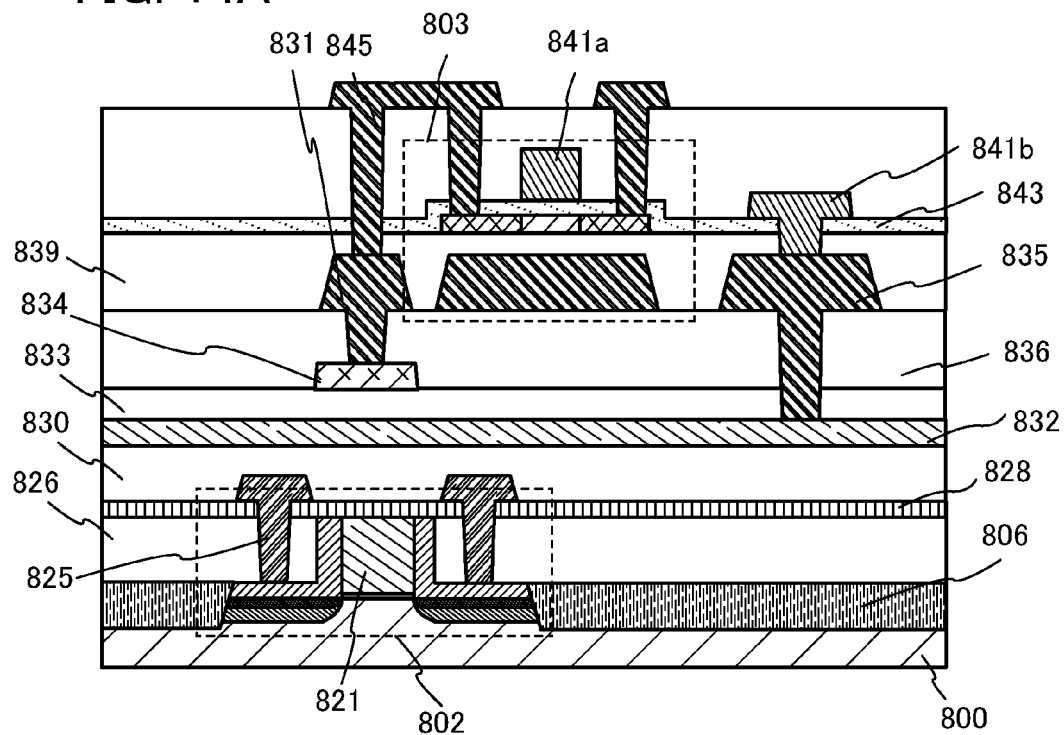
FIGS. 14A to 14C are a cross-sectional view and circuit diagrams which illustrate one embodiment of a semiconductor device.
Figure 14B:
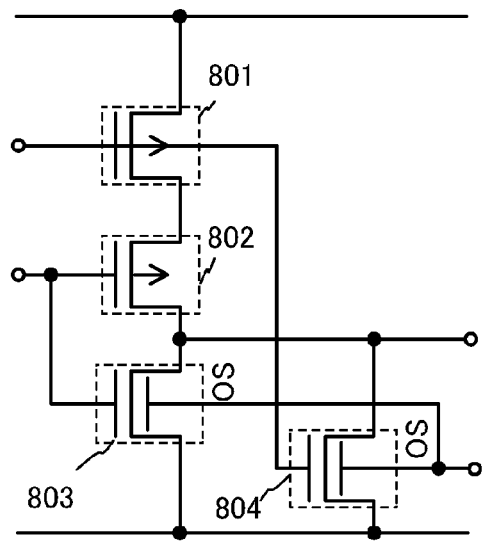
Figure 14C:
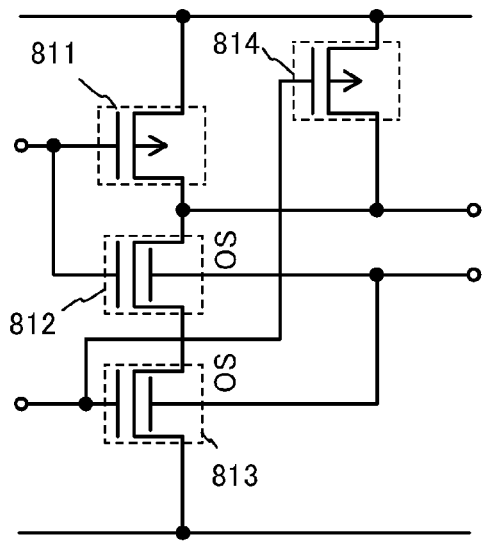

In this embodiment, as other examples of the semiconductor device that uses the transistor described in this specification, a NOR circuit and a NAND circuit, which are logic circuits, are illustrated in FIGS. 14A to 14C. FIG. 14B illustrates the NOR circuit, and FIG. 14C illustrates the NAND circuit. FIG. 14A is a cross-sectional view illustrating the structure of a transistor 802 and a transistor 803 in the NOR circuit in FIG. 14B.

In the NOR circuit and the NAND circuit illustrated in FIGS. 14B and 14C, p-channel transistors 801, 802, 811, and 814 can have a structure similar to that of the transistor 460 described in Embodiment 3. In this embodiment, boron (B), aluminum (Al), gallium (Ga), or the like which is an impurity element imparting p-type conductivity is introduced into a substrate 800 that uses an n-type semiconductor material (e.g., n-type single crystal silicon substrate), to form the p-channel transistors including p-type impurity regions.

In addition, transistors each having a structure similar to that of the transistor 150 in Embodiment 1 and including an oxide semiconductor film in which a channel formation region is formed are applied to n-channel transistors 803, 804, 812, and 813.

In the NOR circuit and the NAND circuit illustrated in FIGS. 14A to 14C, the transistors 803, 804, 812, and 813 each include a thinned channel formation region in the oxide semiconductor film; accordingly, the shift of the threshold voltages of the transistors in the negative direction can be suppressed. Further, two gate electrodes are provided so that the oxide semiconductor film is sandwiched therebetween with an insulating film sandwiched between the oxide semiconductor film and each of the gate electrodes. One of the gate electrodes is used as a so-called back gate. By controlling the potential of the back gate as appropriate, for example, to be GND, the threshold voltages of the transistors 803, 804, 812, and 813 can be moved in the positive direction; consequently, the transistors can be normally-off.

In the example described in this embodiment, the gate electrodes which are provided in the transistor 803 and the transistor 804 and each function as a back gate are electrically connected to each other in the NOR circuit, and the gate electrodes which are provided in the transistor 812 and the transistor 813 and each function as a back gate are electrically connected to each other in the NAND circuit. However, without limitation to the above structure, a structure in which each of the gate electrodes functioning as back gates is independently electrically controlled may be employed.

The semiconductor device illustrated in FIG. 14A is an example in which a single crystal silicon substrate is used as the substrate 800, the transistor 802 is formed using the single crystal silicon substrate, and the transistor 803 including a channel formation region formed using the oxide semiconductor film is stacked over the transistor 802. Over the substrate 800, an element isolation insulating layer 806 is provided to surround the transistor 802.

An electrode 841b electrically connected to a gate electrode 841a of the transistor 803 is electrically connected to an electrode 835 that is provided in the same layer as the transistor 803 through a contact hole provided in a gate insulating film 843 and an insulating film 839. The electrode 835 is electrically connected to a wiring 832 through a contact hole provided in an insulating film 836 and an insulating film 833. Although not clearly illustrated in FIG. 14A, the wiring 832 is electrically connected to a gate electrode 821 of the transistor 802 through a contact hole provided in an insulating film 830, an insulating film 828, and an insulating film 826. Accordingly, the gate electrode 841a of the transistor 803 is electrically connected to the gate electrode 821 of the transistor 802.

Furthermore, although not clearly illustrated in FIG. 14A, an electrode 825 of the transistor 802 is electrically connected to a wiring 834, and the wiring 834 is electrically connected to an electrode 845 of the transistor 803 with an electrode 831. Accordingly, the electrode 825 of the transistor 802 is electrically connected to the electrode 845 of the transistor 803.

Note that the structure enabling electrical connection between the electrode (or the gate electrode) of the transistor 802 and the electrode (or the gate electrode) of the transistor 803 is not limited to the structure illustrated in FIG. 14A, and the structure regarding intervening electrodes (or wirings) or insulating films can be determined as appropriate.

The overlapping structure of the transistor 802 and the transistor 803 illustrated in FIG. 14A can reduce the area of the semiconductor device, leading to higher integration. Further, since the transistor 802 is a transistor that can be normally-off, the logic circuit can be controlled precisely.

As described above, a miniaturized and highly-integrated semiconductor device having high electric characteristics and a method for manufacturing the semiconductor device can be provided.

The structures, methods, and the like described in this embodiment can be combined as appropriate with any of the structures, methods, and the like described in the other embodiments.

Embodiment 6

A central processing unit (CPU) can be formed using any of the transistors described in the above embodiments for at least part of the CPU.

Figure 10A:
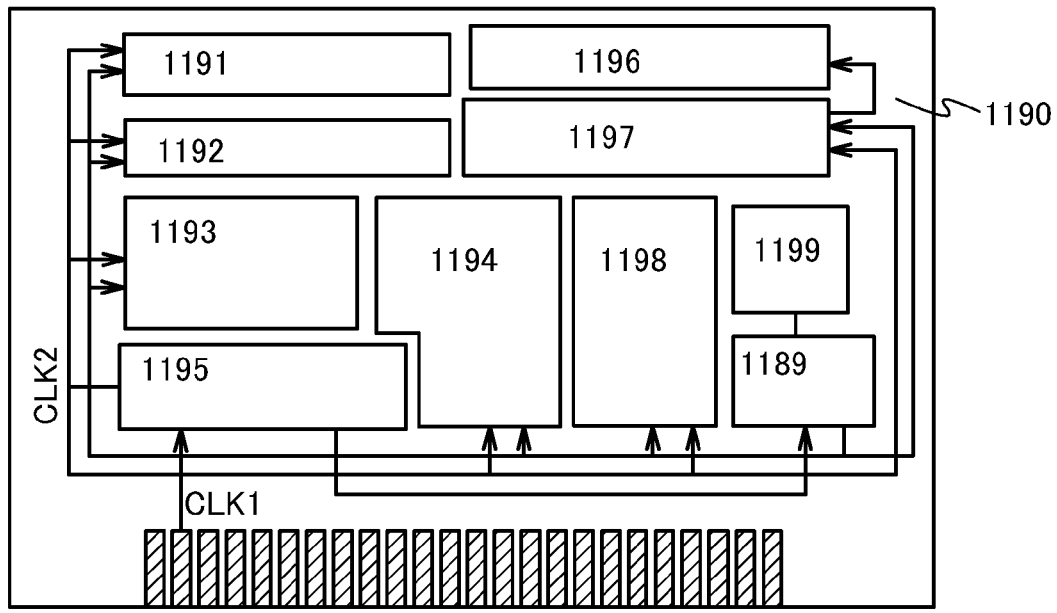
FIGS. 10A to 10C are a block diagram illustrating one embodiment of a semiconductor device and partial circuit diagrams of the block diagram.

FIG. 10A is a block diagram illustrating a specific configuration of a CPU. The CPU illustrated in FIG. 10A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may be provided on a separate chip. Obviously, the CPU illustrated in FIG. 10A is just an example in which the configuration is simplified, and actual CPUs may have various configurations depending on the application.

An instruction input to the CPU through the bus interface 1198 is input to the instruction decoder 1193, decoded therein, and then input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit on the basis of its priority or a mask state. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 10A, a memory cell is provided in the register 1196. As the memory cell of the register 1196, a memory cell including the semiconductor device described in the above embodiment can be used.

In the CPU illustrated in FIG. 10A, the register controller 1197 selects operation of holding data in the register 1196 in accordance with an instruction from the ALU 1191. That is, the register controller 1197 selects whether data is held by a logic element which inverts a logic (logic level) or by a capacitor in the memory cell included in the register 1196. When data holding by the logic element which inverts a logic (logic level) is selected, power supply voltage is supplied to the memory cell in the register 1196. When data holding by the capacitor is selected, the data in the capacitor is rewritten, and supply of the power supply voltage to the memory cell in the register 1196 can be stopped.

Figure 10B:
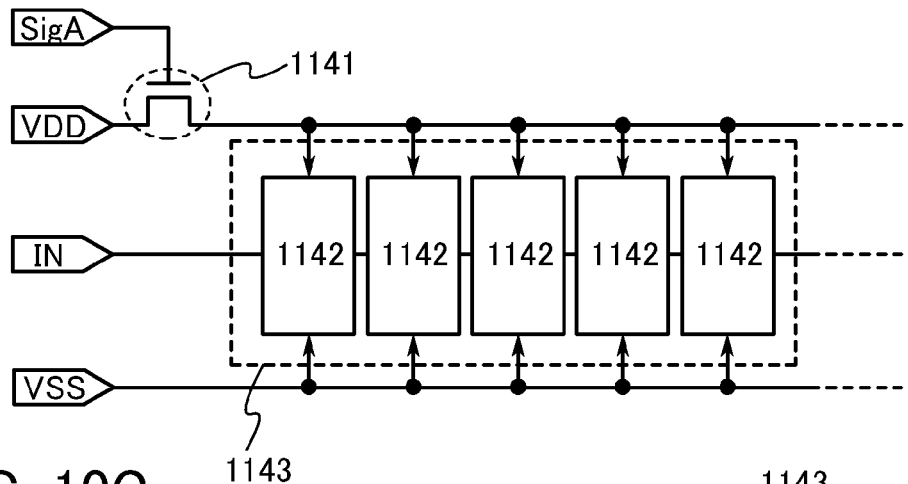
Figure 10C:
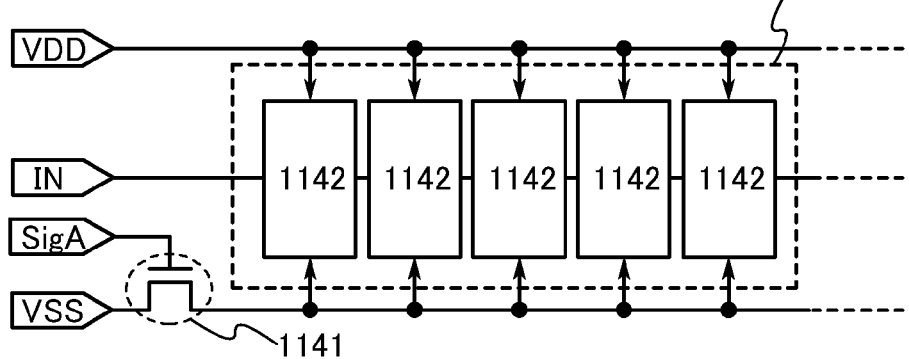

The power supply can be stopped by a switching element provided between a memory cell group and a node to which a power supply potential VDD or a power supply potential VSS is supplied, as illustrated in FIG. 10B or FIG. 10C. Circuits illustrated in FIGS. 10B and 10C are described below.

FIGS. 10B and 10C each illustrate an example of a configuration of a memory circuit including any of the transistors described in the above embodiments as a switching element for controlling supply of a power supply potential to a memory cell.

The memory device illustrated in FIG. 10B includes a switching element 1141 and a memory cell group 1143 including a plurality of memory cells 1142. Specifically, as each of the memory cells 1142, the memory cell described in the above embodiments can be used. Each of the memory cells 1142 included in the memory cell group 1143 is supplied with a high-level power supply potential VDD through the switching element 1141. Further, each of the memory cells 1142 included in the memory cell group 1143 is supplied with a potential of a signal IN and a low-level power supply potential VSS.

As the switching element 1141 in FIG. 10B, any of the transistors described in the above embodiments is used. The switching of the transistor is controlled by a signal SigA supplied to the gate electrode thereof.

Note that FIG. 10B illustrates a configuration in which the switching element 1141 includes only one transistor; however, one embodiment of the present invention is not limited thereto. The switching element 1141 may include a plurality of transistors. In the case where the switching element 1141 includes a plurality of transistors functioning as switching elements, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 10B, the switching element 1141 may control the supply of the low-level power supply potential VSS.

FIG. 10C illustrates an example of a memory device in which each of the memory cells 1142 included in the memory cell group 1143 is supplied with the low-level power supply potential VSS through the switching element 1141. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be held even in the case where operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that power consumption can be reduced.

Although the CPU is given as an example, the transistor can also be applied to an LSI such as a digital signal processor (DSP), a custom LSI, or a field programmable gate array (FPGA).

The structures, methods, and the like described in this embodiment can be combined as appropriate with any of the structures, methods, and the like described in the other embodiments.

Embodiment 7

A semiconductor device disclosed in this specification can be applied to a variety of electronic devices (including game machines). Examples of the electronic devices include display devices of televisions, monitors, and the like, lighting devices, desktop personal computers and notebook personal computers, word processors, image reproduction devices which reproduce still images or moving images stored in recording media such as digital versatile discs (DVDs), portable compact disc (CD) players, radio receivers, tape recorders, headphone stereos, stereos, cordless phone handsets, transceivers, portable wireless devices, mobile phones, car phones, portable game machines, calculators, portable information terminals, electronic notebooks, e-book readers, electronic translators, audio input devices, cameras such as video cameras and digital still cameras, electric shavers, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, smoke detectors, radiation counters, and medical equipment such as dialyzers. Further examples include industrial equipment such as guide lights, traffic lights, belt conveyors, elevators, escalators, industrial robots, and power storage systems. In addition, oil engines, moving objects driven by electric motors using power from non-aqueous secondary batteries, and the like are also included in the range of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like. Specific examples of these electronic devices are illustrated in FIGS. 11A to 11C.

Figure 11A:
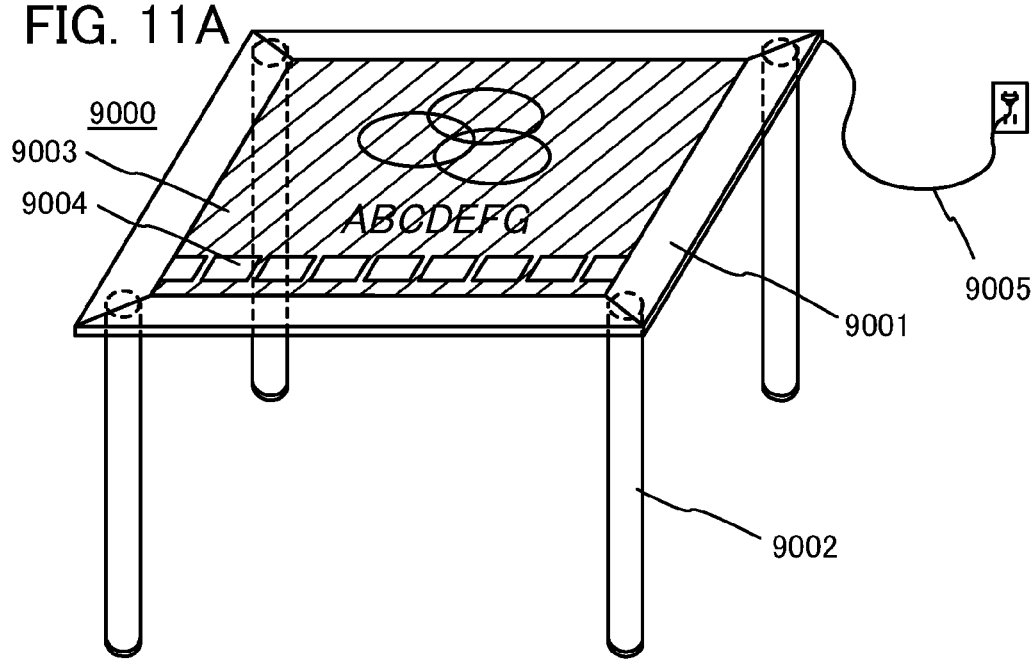
FIGS. 11A to 11C each illustrate an electronic device including a semiconductor device according to one embodiment of the present invention.
Figure 11B:
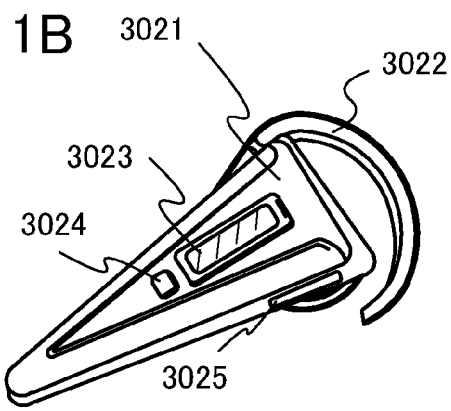
Figure 11C:
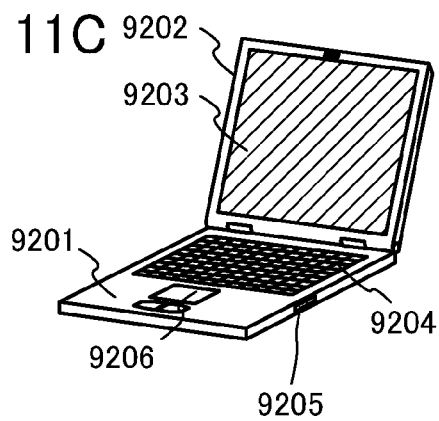

FIG. 11A illustrates a table 9000 having a display portion. In the table 9000, a display portion 9003 is incorporated in a housing 9001 and an image can be displayed on the display portion 9003. Note that the housing 9001 is supported by four leg portions 9002. Further, the housing 9001 is provided with a power cord 9005 for supplying power.

The transistor described in any of Embodiments 1 and 2 can be used in the display portion 9003 so that the electronic device can have high reliability.

The display portion 9003 has a touch-input function. When a user touches displayed buttons 9004 which are displayed on the display portion 9003 of the table 9000 with his/her finger or the like, the user can carry out operation of the screen and input of information. Further, when the table is capable of communicating with other home appliances or control the home appliances, the table 9000 may function as a control device which controls the home appliances by operation on the screen. For example, with the use of a semiconductor device having an image sensing function, the display portion 9003 can have a touch-input function.

Further, the screen of the display portion 9003 can be placed perpendicular to a floor with a hinge provided for the housing 9001; thus, the table 9000 can also be used as a television device. When a television device having a large screen is set in a small room, an open space is reduced; however, when a display portion is incorporated in a table, a space in the room can be efficiently used.

FIG. 11B illustrates a portable music player, which includes, in a main body 3021, a display portion 3023, a fixing portion 3022 with which the portable music player is worn on the ear, a speaker, an operation button 3024, an external memory slot 3025, and the like. The transistor described in any of Embodiments 1 and 2 or the semiconductor device described in any of Embodiments 3 to 5 is used in a memory or a CPU incorporated in the main body 3021, whereby a portable music player (PDA) whose power consumption is reduced can be provided.

Furthermore, when the portable music player illustrated in FIG. 11B has an antenna, a microphone function, or a wireless communication function and is used with a mobile phone, a user can talk on the phone wirelessly in a hands-free way while driving a car or the like.

FIG. 11C illustrates a computer, which includes a main body 9201 including a CPU, a housing 9202, a display portion 9203, a keyboard 9204, an external connection port 9205, a pointing device 9206, and the like. The computer includes a semiconductor device manufactured according to one embodiment of the present invention for the display portion 9203. When the CPU described in Embodiment 6 is used, power consumption of the computer can be reduced.

Figure 12A:
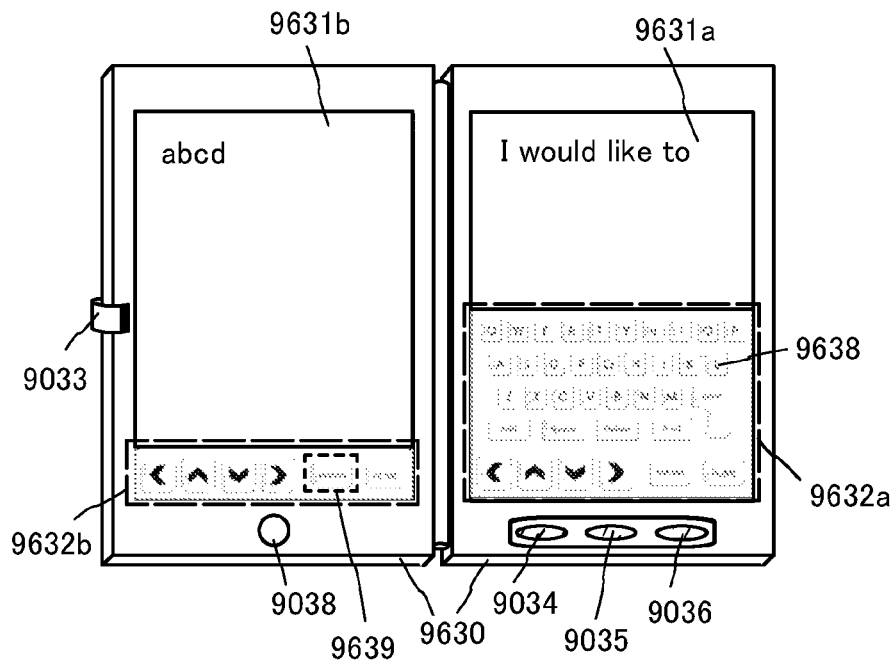
FIGS. 12A to 12C illustrate an electronic device including a semiconductor device according to one embodiment of the present invention.
Figure 12B:
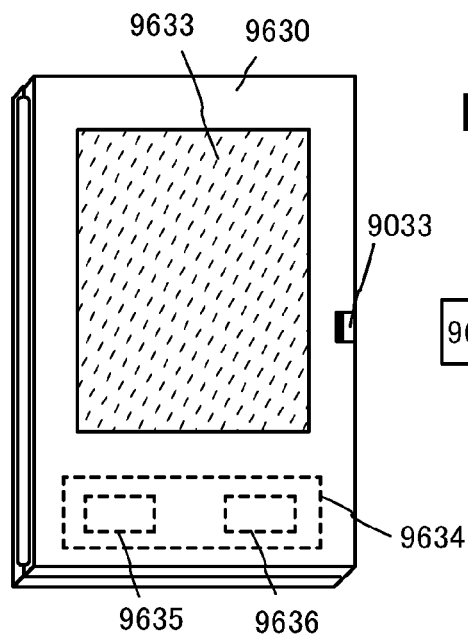

FIGS. 12A and 12B illustrate a foldable tablet terminal. The tablet terminal is opened in FIG. 12A. The tablet terminal includes a housing 9630, a display portion 9631a, a display portion 9631b, a display mode switch 9034, a power switch 9035, a power saver switch 9036, a clasp 9033, and an operation switch 9038.

In the portable device illustrated in FIGS. 12A and 12B, a memory such as an SRAM or a DRAM is used for temporarily storing image data or the like. For example, the semiconductor device described in any of Embodiments 3 to 5 can be used as a memory. By employing the semiconductor device described in the above embodiment for the memory, data can be written and read at high speed and held for a long time, and power consumption can be sufficiently reduced.

Part of the display portion 9631a can be a touch panel region 9632a and data can be input when a displayed operation key 9638 is touched. Although a structure in which a half region in the display portion 9631a has only a display function and the other half region has a touch panel function is shown as an example, the display portion 9631a is not limited to this structure. The whole region in the display portion 9631a may have a touch panel function. For example, the display portion 9631a can display a keyboard in its whole region to serve as a touch panel, and the display portion 9631b can be used as a display screen.

As in the display portion 9631a, part of the display portion 9631b can be a touch panel region 9632b. When a keyboard display switching button 9639 displayed on the touch panel is touched with a finger, a stylus, or the like, a keyboard can be displayed on the display portion 9631b.

Touch input can be performed in the touch panel region 9632a and the touch panel region 9632b at the same time.

The display mode switch 9034 can switch the display between portrait mode, landscape mode, and the like, and between monochrome display and color display, for example. The power saver switch 9036 can control display luminance in accordance with the amount of external light in use of the tablet terminal detected by an optical sensor incorporated in the tablet terminal. In addition to the optical sensor, another detection device including a sensor for detecting inclination, such as a gyroscope or an acceleration sensor, may be incorporated in the tablet terminal.

Note that FIG. 12A shows an example in which the display portion 9631a and the display portion 9631b have the same display area; however, without limitation, one of the display portions may be different from the other display portion in size and display quality. For example, one display panel may be capable of higher-definition display than the other display panel.

The tablet terminal is closed in FIG. 12B. The tablet terminal includes the housing 9630, a solar cell 9633, a charge and discharge control circuit 9634, a battery 9635, and a DCDC converter 9636. In FIG. 12B, a structure including the battery 9635 and the DCDC converter 9636 is illustrated as an example of the charge and discharge control circuit 9634.

Since the tablet terminal is foldable, the housing 9630 can be closed when the tablet terminal is not used. As a result, the display portion 9631a and the display portion 9631b can be protected; thus, a tablet terminal which has excellent durability and excellent reliability in terms of long-term use can be provided.

In addition, the tablet terminal illustrated in FIGS. 12A and 12B can have a function of displaying a variety of kinds of data (e.g., a still image, a moving image, and a text image), a function of displaying a calendar, a date, the time, or the like on the display portion, a touch-input function of operating or editing the data displayed on the display portion by touch input, a function of controlling processing by a variety of kinds of software (programs), and the like.

The solar cell 9633 provided on a surface of the tablet terminal can supply power to the touch panel, the display portion, a video signal processing portion, or the like. Note that the solar cell 9633 can be provided on one or both surfaces of the housing 9630, so that the battery 9635 can be charged efficiently. The use of a lithium ion battery as the battery 9635 is advantageous in downsizing or the like.

Figure 12C:
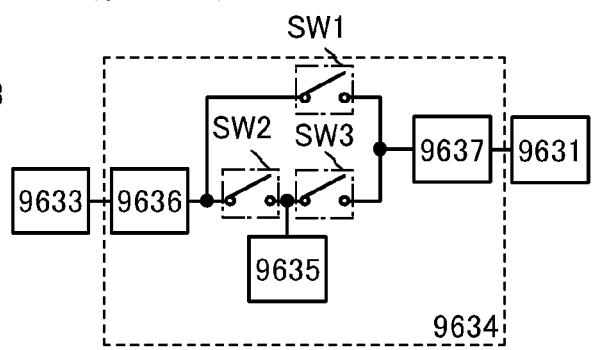

The structure and the operation of the charge and discharge control circuit 9634 illustrated in FIG. 12B will be described with reference to a block diagram in FIG. 12C. The solar cell 9633, the battery 9635, the DCDC converter 9636, a converter 9637, switches SW1 to SW3, and a display portion 9631 are illustrated in FIG. 12C, and the battery 9635, the DCDC converter 9636, the converter 9637, and the switches SW1 to SW3 correspond to the charge and discharge control circuit 9634 illustrated in FIG. 12B.

First, an example of the operation in the case where power is generated by the solar cell 9633 using external light is described. The voltage of power generated by the solar cell is stepped up or down by the DCDC converter 9636 so that the power has a voltage for charging the battery 9635. Then, when the power from the solar cell 9633 is used for the operation of the display portion 9631, the switch SW1 is turned on and the voltage of the power is stepped up or down by the converter 9637 so as to be a voltage needed for the display portion 9631. In addition, when display on the display portion 9631 is not performed, the switch SW1 is turned off and the switch SW2 is turned on so that the battery 9635 may be charged.

Note that the solar cell 9633 is described as an example of a power generation means; however, without limitation, the battery 9635 may be charged using another power generation means such as a piezoelectric element or a thermoelectric conversion element (Peltier element). For example, a non-contact electric power transmission module which transmits and receives power wirelessly (without contact) to charge the battery 9635, or a combination of the solar cell 9633 and another means for charge may be used.

Figure 13A:
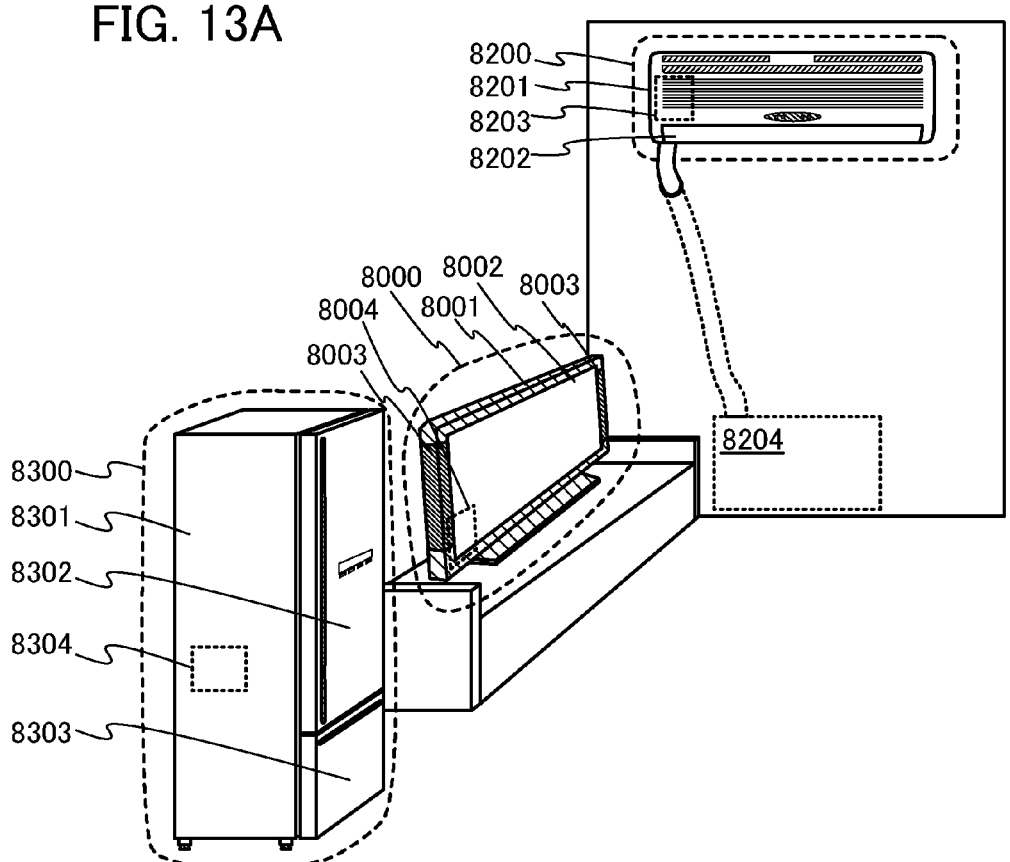
FIGS. 13A to 13C illustrate electronic devices each including a semiconductor device according to one embodiment of the present invention.

In a television device 8000 in FIG. 13A, a display portion 8002 is incorporated in a housing 8001. The display portion 8002 displays an image and a speaker portion 8003 can output sound. The transistor described in Embodiment 1 or 2 can be used in the display portion 8002.

A semiconductor display device such as a liquid crystal display device, a light-emitting device in which a light-emitting element such as an organic EL element is provided in each pixel, an electrophoresis display device, a digital micromirror device (DMD), a plasma display panel (PDP), or the like can be used in the display portion 8002.

The television device 8000 may be provided with a receiver, a modem, and the like. With the receiver, the television device 8000 can receive general television broadcasting. Furthermore, when the television device 8000 is connected to a communication network by wired or wireless connection via the modem, one-way (from a transmitter to a receiver) or two-way (between a transmitter and a receiver, between receivers, or the like) data communication can be performed.

In addition, the television device 8000 may include a CPU for performing information communication or a memory. Any of the memories and the CPU described in Embodiments 3 to 6 can be used in the television device 8000.

In FIG. 13A, an air conditioner including an indoor unit 8200 and an outdoor unit 8204 is an example of an electronic device including the CPU of Embodiment 6. Specifically, the indoor unit 8200 includes a housing 8201, a ventilation duct 8202, a CPU 8203, and the like. FIG. 13A shows the case where the CPU 8203 is provided in the indoor unit 8200; the CPU 8203 may be provided in the outdoor unit 8204. Alternatively, the CPU 8203 may be provided in both the indoor unit 8200 and the outdoor unit 8204. Since the CPU described in Embodiment 6 is formed using an oxide semiconductor, an air conditioner which has excellent heat resistance and high reliability can be provided with the use of the CPU.

In FIG. 13A, an electric refrigerator-freezer 8300 is an example of an electronic device which is provided with the CPU formed using an oxide semiconductor. Specifically, the electric refrigerator-freezer 8300 includes a housing 8301, a refrigerator door 8302, a freezer door 8303, a CPU 8304, and the like. The CPU 8304 is provided in the housing 8301 in FIG. 13A. When the CPU described in Embodiment 6 is used as the CPU 8304 of the electric refrigerator-freezer 8300, power saving can be achieved.

Figure 13B:
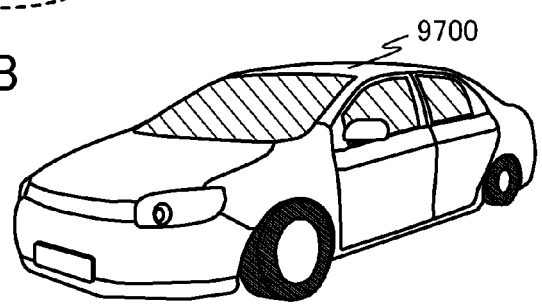
Figure 13C:
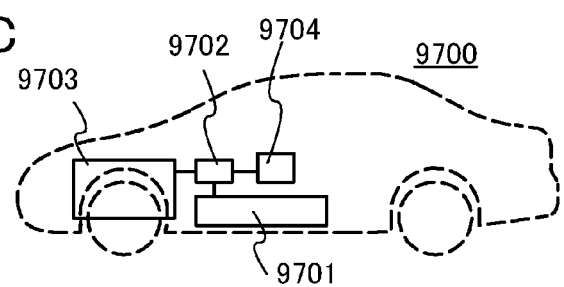

FIGS. 13B and 13C illustrate an example of an electric vehicle which is an example of an electronic device. An electric vehicle 9700 is equipped with a secondary battery 9701. The output of power of the secondary battery 9701 is controlled by a control circuit 9702 and the power is supplied to a driving device 9703. The control circuit 9702 is controlled by a processing unit 9704 including a ROM, a RAM, a CPU, or the like which is not illustrated. When the CPU described in Embodiment 6 is used as the CPU in the electric vehicle 9700, power saving can be achieved.

The driving device 9703 includes a DC motor or an AC motor either alone or in combination with an internal-combustion engine. The processing unit 9704 outputs a control signal to the control circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

The structures, methods, and the like described in this embodiment can be combined as appropriate with any of the structures, methods, and the like described in the other embodiments.

EXPLANATION OF REFERENCE

100: substrate, 102: base insulating film, 104a: gate electrode, 104b: lower electrode film, 106a: gate insulating film, 106b: inter-electrode insulating film, 108: oxide semiconductor film, 108a: channel formation region, 108b: low-resistance region, 108c: low-resistance region, 110a: gate insulating film, 110b: inter-electrode insulating film, 112a: gate electrode, 112b: upper electrode film, 114: interlayer film, 116a: source electrode, 116b: drain electrode, 120: impurity, 150: transistor, 160: capacitor, 170: transistor, 180: capacitor, 190: transistor, 400: substrate, 408: gate insulating film, 410: gate electrode, 416: channel formation region, 420: impurity region, 424: intermetallic compound region, 428: insulating film, 430: insulating film, 442: first interlayer film, 444: second interlayer film, 446: wiring, 448: third interlayer film, 450: fourth interlayer film, 452: base insulating film, 456: wiring, 458: protective film, 460: transistor, 462: transistor, 464: capacitor, 490: partition, 492: transistor, 494: capacitor, 650: memory cell, 651: memory cell array, 651a: memory cell array, 651b: memory cell array, 653: peripheral circuit, 800: substrate, 801: transistor, 802: transistor, 803: transistor, 804: transistor, 806: element isolation insulating layer, 811: transistor, 812: transistor, 813: transistor, 814: transistor, 821: gate electrode, 825: electrode, 826: insulating film, 828: insulating film, 830: insulating film, 831: electrode, 832: wiring, 833: insulating film, 834: wiring, 835: electrode, 836: insulating film, 839: insulating film, 841a: gate electrode, 841b: electrode, 843: gate insulating film, 845: electrode, 1141: switching element, 1142: memory cell, 1143: memory cell group, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 3021: main body, 3022: fixing portion, 3023: display portion, 3024: operation button, 3025: external memory slot, 8000: television device, 8001: housing, 8002: display portion, 8003: speaker portion, 8200: indoor unit, 8201: housing, 8202: ventilation duct, 8203: CPU, 8204: outdoor unit, 8300: electric refrigerator-freezer, 8301: housing, 8302: refrigerator door, 8303: freezer door, 8304: CPU, 9000: table, 9001: housing, 9002: leg portion, 9003: display portion, 9004: displayed button, 9005: power cord, 9033: clasp, 9034: switch, 9035: power switch, 9036: switch, 9038: operation switch, 9201: main body, 9202: housing, 9203: display portion, 9204: keyboard, 9205: external connection port, 9206: pointing device, 9630: housing, 9631: display portion, 9631*a*: display portion, 9631*b*: display portion, 9632*a*: region, 9632*b*: region, 9633: solar cell, 9634: charge and discharge control circuit, 9635: battery, 9636: DCDC converter, 9637: converter, 9638: operation key, 9639: button, 9700: electric vehicle, 9701: secondary battery, 9702: control circuit, 9703: driving device, 9704: processing unit.

This application is based on Japanese Patent Application serial no. 2012-096443 filed with Japan Patent Office on Apr. 20, 2012, the entire contents of which are hereby incorporated by reference.

The invention claimed is:

1. A semiconductor device comprising:
a first gate electrode over a surface of a substrate, the first gate electrode extending in a first direction parallel to the surface of the substrate;
a first gate insulating film covering a top surface and side surfaces of the first gate electrode;
an oxide semiconductor film covering the first gate electrode with the first gate insulating film interposed between the top surface of the first gate electrode and the oxide semiconductor film and between the side surfaces of the first gate electrode and the oxide semiconductor film;
a second gate insulating film covering the oxide semiconductor film; and
a second gate electrode over the second gate insulating film, the second gate electrode extending in a second direction parallel to the surface of the substrate,
wherein the second direction is substantially perpendicular to the first direction.

2. The semiconductor device according to claim 1, further comprising an insulating film over the second gate insulating film and the second gate electrode.

3. The semiconductor device according to claim 1, further comprising a capacitor, the capacitor comprising:
a lower electrode film comprising the same material as the first gate electrode; and
an upper electrode film comprising the same material as the second gate electrode.

4. The semiconductor device according to claim 3,
wherein the capacitor comprises an insulating film between the lower electrode film and the upper electrode film, and
wherein the insulating film comprises the same material as the first gate insulating film or the second gate insulating film.

5. The semiconductor device according to claim 3, wherein a height of the lower electrode film is larger than a width of the lower electrode film.

6. A semiconductor device comprising:
a first gate electrode over a surface of a substrate, the first gate electrode extending in a first direction parallel to the surface of the substrate;
a first gate insulating film covering a top surface and side surfaces of the first gate electrode;
an oxide semiconductor film covering the first gate electrode with the first gate insulating film interposed between the top surface of the first gate electrode and the oxide semiconductor film and between the side surfaces of the first gate electrode and the oxide semiconductor film;
a source electrode and a drain electrode electrically connected to the oxide semiconductor film;
a second gate insulating film covering the oxide semiconductor film, the source electrode, and the drain electrode; and
a second gate electrode over the second gate insulating film, the second gate electrode extending in a second direction parallel to the surface of the substrate,
wherein the second direction is substantially perpendicular to the first direction.

7. The semiconductor device according to claim 6, wherein the second gate electrode is provided between the source electrode and the drain electrode.

8. The semiconductor device according to claim 6, further comprising an insulating film over the second gate insulating film and the second gate electrode.

9. The semiconductor device according to claim 6, further comprising a capacitor, the capacitor comprising:
a lower electrode film comprising the same material as the first gate electrode; and
an upper electrode film comprising the same material as the second gate electrode.

10. The semiconductor device according to claim 9,
wherein the capacitor comprises an insulating film between the lower electrode film and the upper electrode film, and
wherein the insulating film comprises the same material as the first gate insulating film or the second gate insulating film.

11. The semiconductor device according to claim 9, wherein a height of the lower electrode film is larger than a width of the lower electrode film.

12. A semiconductor device comprising:
a first gate electrode over a surface of a substrate, the first gate electrode extending in a first direction parallel to the surface of the substrate;
an oxide semiconductor film covering a top surface and side surfaces of the first gate electrode, the oxide semiconductor film extending in the first direction as a channel length direction;
a source electrode and a drain electrode electrically connected to the oxide semiconductor film; and
a second gate electrode over the oxide semiconductor film, the second gate electrode extending in a second direction parallel to the surface of the substrate,
wherein the second direction is substantially perpendicular to the first direction.

13. The semiconductor device according to claim 12, further comprising an insulating film over the second gate electrode.

14. The semiconductor device according to claim 12, further comprising a capacitor, the capacitor comprising:
a lower electrode film comprising the same material as the first gate electrode; and
an upper electrode film comprising the same material as the second gate electrode.

15. The semiconductor device according to claim 14, wherein the capacitor comprises an insulating film between the lower electrode film and the upper electrode film.

16. The semiconductor device according to claim 14, wherein a height of the lower electrode film is larger than a width of the lower electrode film.

17. The semiconductor device according to claim 12, wherein the second direction is a channel width direction.

* * * * *